(12) United States Patent
Furumiya et al.

(10) Patent No.: US 8,330,520 B2
(45) Date of Patent: Dec. 11, 2012

(54) LIMITER CIRCUIT

(75) Inventors: Tetsuo Furumiya, Kyoto (JP); Junichi Ohi, Muko (JP)

(73) Assignee: Shimadzu Corporation, Kyoto (JP)

( * ) Notice: Subject to any disclaimer, the term of this patent is extended or adjusted under 35 U.S.C. 154(b) by 174 days.

(21) Appl. No.: 12/996,636

(22) PCT Filed: Jun. 9, 2008

(86) PCT No.: PCT/JP2008/060566
§ 371 (c)(1),
(2), (4) Date: Dec. 7, 2010

(87) PCT Pub. No.: WO2009/150709
PCT Pub. Date: Dec. 17, 2009

(65) Prior Publication Data
US 2011/0089989 A1  Apr. 21, 2011

(51) Int. Cl.
*H03K 5/08* (2006.01)

(52) U.S. Cl. ......... 327/309; 327/313; 327/318; 327/321
(58) Field of Classification Search .................. 327/309, 327/313, 318, 321
See application file for complete search history.

(56) References Cited

U.S. PATENT DOCUMENTS
7,368,981 B2 * 5/2008 Miyagi .................... 327/557
* cited by examiner

*Primary Examiner* — Kenneth B. Wells
(74) *Attorney, Agent, or Firm* — Cheng Law Group, PLLC

(57) ABSTRACT

The limiter circuit of this invention is a limiter circuit which, by switching action of a pair of transistors, allows passage of only signal voltage components of an input signal voltage included in ranges of an upper limit signal voltage and a lower limit signal voltage. With this construction, the pair of transistors carry out comparisons between the input signal voltage and threshold signal voltages and line switching at the same time. Therefore, there is no influence of propagation delay speed, and no switching noise occurs at times of line switching. Since diodes are not used, a high-speed limiter circuit can be manufactured.

13 Claims, 16 Drawing Sheets

LIMITER CIRCUIT

TECHNICAL FIELD

This invention relates to limiter circuits for limiting upper and lower limits of an input voltage, and more particularly to high-speed limiter circuits formed in semiconductor integrated circuits.

BACKGROUND ART

Conventionally, a limiter circuit for limiting an upper limit or a lower limit or upper and lower limits of an analog signal inputted is widely used in a semiconductor integrated circuit for the purposes of removing noise components, protection and operational stability of the circuit, and also analog signal processing. FIG. 17 shows an ideal diode circuit widely used as limiter circuit. An ideal diode circuit 70 includes diodes D1, D2, D3, D4, differential amplifiers Q71, Q72, and resistors R71, R72.

FIG. 18 shows an example of operation of the ideal diode circuit 70. When an input signal Vin with a waveform as shown in FIG. 18(a) is applied, and when the input signal Vin is larger than an upper limit threshold signal VH, the diode D1 becomes ON, the diode D2 becomes OFF, and voltage Vn20 at node N20 becomes equal to VH. When the input signal Vin is smaller than the upper limit threshold signal VH, the diode D1 becomes OFF, the diode D2 becomes ON, and voltage Vn20 at node N20 becomes equal to the input signal Vin.

Similarly, when node N20 is smaller than a lower limit threshold signal VL, the diode D3 becomes ON, the diode D4 becomes OFF, and an output Vout becomes equal to the lower limit threshold signal VL. When voltage Vn20 at node N20 is larger than the lower limit threshold signal VL, the diode D3 becomes OFF, the diode D4 becomes ON, and the output signal Vout becomes equal to the voltage Vn20 at node N20.

DISCLOSURE OF THE INVENTION

Problem to be Solved by the Invention

Operation of this ideal diode circuit 70, as shown in FIG. 18(b), is a limit operation which limits upper and lower limits of the input signal Vin. This ideal diode circuit 70 can provide a sufficient limit operation for a signal with a low-speed frequency. However, for a signal with a high-speed frequency, delays in following the waveform will occur as shown in FIG. 18(c), under the influence of reverse recovery time of the diodes D1, D2, D3, D4 and forward voltage drop. As a result, the output signal Vout is subject to omission periods and periods of output beyond the upper or lower threshold voltages. Thus, it has been impossible to realize adequate limit operation.

As a method of solving the above problem, there is a method which uses high-speed diodes with a short reverse recovery time such as Schottky barrier diodes. However, even high-speed diodes have a reverse recovery time of about several nanoseconds. In a standard semiconductor process, it is difficult to make high-speed diodes. It will become high cost even if possible. Thus, they are not suitable for a limiter circuit formed in a semiconductor integrated circuit.

Further, when the lower limit threshold signal VL varies with time in the foregoing ideal diode circuit 70, the lower limit of output signal Vout also varies. In the field of radiation measurement, for example, it is widely practised to identify an incident position by carrying out, with an analog circuit, centroid calculation of radiation signals inputted through numerous channels. In order to remove signal components unnecessary to the centroid calculation in this process, an application circuit of the foregoing ideal diode circuit is used as a limiter circuit.

As a lower limit threshold signal VL applied to this limiter circuit, instead of having a fixed value, a dynamic threshold signal VL can be used, which is time variable in proportion to the signal level of a radiation signal varying each time. In this case, the lower limit of output signal Vout of the limiter circuit is required to have a constant value. However, the lower limit of output signal Vout of the above ideal diode circuit 70 will become a dynamic lower limit threshold signal VL. Since the lower limit of output signal Vout varies when the dynamic lower limit threshold signal VL is used, it is necessary to cancel variations in the lower limit of output signal Vout due to the variations of lower limit threshold signal VL. This poses a problem of increasing components of the limiter circuit, thereby complicating the circuit.

This invention has been made having regard to the state of the art noted above, and its object is to provide limiter circuits having a simple circuit configuration, which can realize a limit operation also with a signal of high-speed frequency.

Means for Solving the Problem

To fulfill the above object, this invention provides the following construction.

A limiter circuit according to a first invention is a limiter circuit to which an input signal voltage, an upper limit threshold signal voltage and a lower limit threshold signal voltage are inputted, comprising an upper limit limiter circuit having a pair of transistors switchable ON and OFF in response to levels of the input signal voltage and the upper limit threshold signal voltage, for cutting voltage components higher than the upper limit threshold signal voltage from the input signal voltage, increasing the input signal voltage, and outputting an upper limit signal voltage; a lower limit threshold correcting circuit for correcting the lower limit threshold signal voltage in accordance with a voltage to which the input signal voltage is increased by the upper limit limiter circuit, and outputting an upper limit threshold correction signal voltage; a lower limit limiter circuit having a different pair of transistors switchable ON and OFF in response to levels of the upper limit signal voltage and the upper limit threshold correction signal voltage, for cutting voltage components lower than the lower limit threshold correction signal voltage from the upper limit signal voltage, decreasing the upper limit signal voltage, and outputting an upper and lower limit signal voltage; a potential correcting circuit for correcting the lower limit threshold correction signal voltage in accordance with a voltage to which the upper limit signal voltage is decreased by the lower limit limiter circuit, and outputting a first reference signal voltage; and an adding and subtracting circuit for generating an output signal voltage by adding a second reference signal voltage inputted separately, to a signal voltage generated according to a voltage difference between the upper and lower limit signal voltage and the first reference signal voltage; whereby the limiter circuit allows passage of only signal voltage components of the input signal voltage included in ranges of the upper limit threshold signal voltage and the lower limit threshold signal voltage.

One example of construction in the first invention may be as follows. The upper limit limiter circuit includes a pair of first and second PNP transistors having emitter terminals connected to each other, and a first constant current generating device connected between the emitter terminals of the first and second PNP transistors and a first common voltage, the input signal voltage being inputted to a base terminal of the first PNP transistor, the upper limit threshold signal voltage being inputted to a base terminal of the second PNP transistor, the first constant current generating device limiting current flow to the first or second PNP transistor; the lower limit threshold correcting circuit includes a third PNP transistor having a base terminal for receiving input of the lower limit threshold signal voltage, and a second constant current generating device connected between an emitter terminal of the third PNP transistor and the first common voltage, the second constant current generating device limiting current flow to the third PNP transistor; the lower limit limiter circuit includes a pair of first and second NPN transistors having emitter terminals connected to each other, and a third constant current generating device connected between the emitter terminals of the first and second NPN transistors and a second common voltage, the emitter terminals of the first and second PNP transistors being connected to a base terminal of the first NPN transistor, the emitter terminal of the third PNP transistor being connected to a base terminal of the second NPN transistor, the third constant current generating device limiting current flow to the first or second PNP transistor; the potential correcting circuit includes a third NPN transistor having a base terminal connected with the emitter terminal of the third PNP transistor, and a fourth constant current generating device connected between an emitter terminal of the third NPN transistor and the second common voltage, the fourth constant current generating device limiting current flow to the third NPN transistor; and the adding and subtracting circuit includes a differential amplifier having a positive input node connected with the emitter terminals of the first and second NPN transistors through a first input resistor, and a negative input node connected with the emitter terminal of the third NPN transistor through a second input resistor, an output terminal and the negative input node of the differential amplifier being connected through a feedback resister, the second reference signal voltage being inputted to the positive input node of the differential amplifier through a compensation resistor.

A limiter circuit according to a second invention is a limiter circuit to which an input signal voltage, an upper limit threshold signal voltage and a lower limit threshold signal voltage are inputted, comprising an upper limit limiter circuit having a pair of transistors switchable ON and OFF in response to levels of the input signal voltage and the upper limit threshold signal voltage, for cutting voltage components higher than the upper limit threshold signal voltage from the input signal voltage, increasing the input signal voltage, and outputting an upper limit signal voltage; a lower limit threshold correcting circuit for correcting the lower limit threshold signal voltage in accordance with a voltage to which the input signal voltage is increased by the upper limit limiter circuit, and outputting an lower limit threshold correction signal voltage; a lower limit limiter circuit having a different pair of transistors switchable ON and OFF in response to levels of the upper limit signal voltage and the lower limit threshold correction signal voltage, for cutting voltage components lower than the lower limit threshold correction signal voltage from the upper limit signal voltage, decreasing the upper limit signal voltage, and outputting an upper and lower limit signal voltage; and an adding and subtracting circuit for generating an output signal voltage by adding, to a signal voltage generated according to a voltage difference between the upper and lower limit signal voltage and a first reference signal voltage inputted separately, a second reference signal voltage inputted further separately; whereby the limiter circuit allows passage of only signal voltage components of the input signal voltage included in ranges of the upper limit threshold signal voltage and the lower limit threshold signal voltage.

One example of construction in the second invention may be as follows. The upper limit limiter circuit includes a pair of first and second PNP transistors having emitter terminals connected to each other, and a first constant current generating device connected between the emitter terminals of the first and second PNP transistors and a first common voltage, the input signal voltage being inputted to a base terminal of the first PNP transistor, the upper limit threshold signal voltage being inputted to a base terminal of the second PNP transistor, the first constant current generating device limiting current flow to the first or second PNP transistor; the lower limit threshold correcting circuit includes a third PNP transistor having a base terminal for receiving input of the lower limit threshold signal voltage, and a second constant current generating device connected between an emitter terminal of the third PNP transistor and the first common voltage, the second constant current generating device limiting current flow to the third PNP transistor; the lower limit limiter circuit includes a pair of first and second NPN transistors having emitter terminals connected to each other, and a third constant current generating device connected between the emitter terminals of the first and second NPN transistors and a second common voltage, the emitter terminals of the first and second PNP transistors being connected to a base terminal of the first NPN transistor, the emitter terminal of the third PNP transistor being connected to a base terminal of the second NPN transistor, the third constant current generating device limiting current flow to the first or second PNP transistor; and the adding and subtracting circuit includes a differential amplifier having a positive input node connected with the emitter terminals of the first and second NPN transistors through a first input resistor, and a negative input node connected with the first reference signal voltage through a second input resistor, an output terminal and the negative input node of the differential amplifier being connected through a feedback resister, the second reference signal voltage being inputted to the positive input node of the differential amplifier through a compensation resistor.

A limiter circuit according to a third invention is a limiter circuit to which an input signal voltage and a lower limit threshold signal voltage are inputted, comprising a lower limit limiter circuit having a pair of transistors switchable ON and OFF in response to levels of the input signal voltage and the lower limit threshold correction signal voltage, for decreasing the input signal voltage, and outputting a lower limit signal voltage; a potential correcting circuit for correcting the lower limit threshold signal voltage in accordance with a voltage to which the input signal voltage is decreased by the lower limit limiter circuit, and outputting a first reference signal voltage; and an adding and subtracting circuit for generating an output signal voltage by adding a second reference signal voltage inputted separately, to a signal voltage generated according to a voltage difference between the lower limit signal voltage and the first reference signal voltage; whereby the limiter circuit allows passage of only signal voltage components of the input signal voltage higher than the lower limit threshold signal voltage.

One example of construction in the third invention according to claim 7 may be as follows. The lower limit limiter circuit includes a pair of first and second NPN transistors having emitter terminals connected to each other, and a first constant current generating device connected between the emitter terminals of the first and second NPN transistors and a second common voltage, the input signal being connected to a base terminal of the first NPN transistor, the lower limit threshold signal voltage being inputted to a base terminal of the second NPN transistor, the first constant current generating device limiting current flow to the first or second NPN transistor; the potential correcting circuit includes a third NPN transistor having a base terminal to which the lower limit threshold signal voltage is inputted, and a second constant current generating device connected between an emitter terminal of the third NPN transistor and the second common voltage, the second constant current generating device limiting current flow to the third NPN transistor; and the adding and subtracting circuit includes a differential amplifier having a positive input node connected with the emitter terminals of the first and second NPN transistors through a first input resistor, and a negative input node connected with the emitter terminal of the third NPN transistor through a second input resistor, an output terminal and the negative input node of the differential amplifier being connected through a feedback resister, the second reference signal voltage being connected to the positive input node of the differential amplifier through a compensation resistor.

Effects of the Invention

With the limiter circuit according to this invention, a pair of transistors carry out comparisons between the input signal voltage and threshold signal voltages and line switching at the same time. Therefore, there is no influence of propagation delay. Further, no switching noise occurs at times of line switching. A simple circuit construction can carry out a limit operation also with high-speed frequency signals.

DESCRIPTION OF REFERENCES

Figure 1:
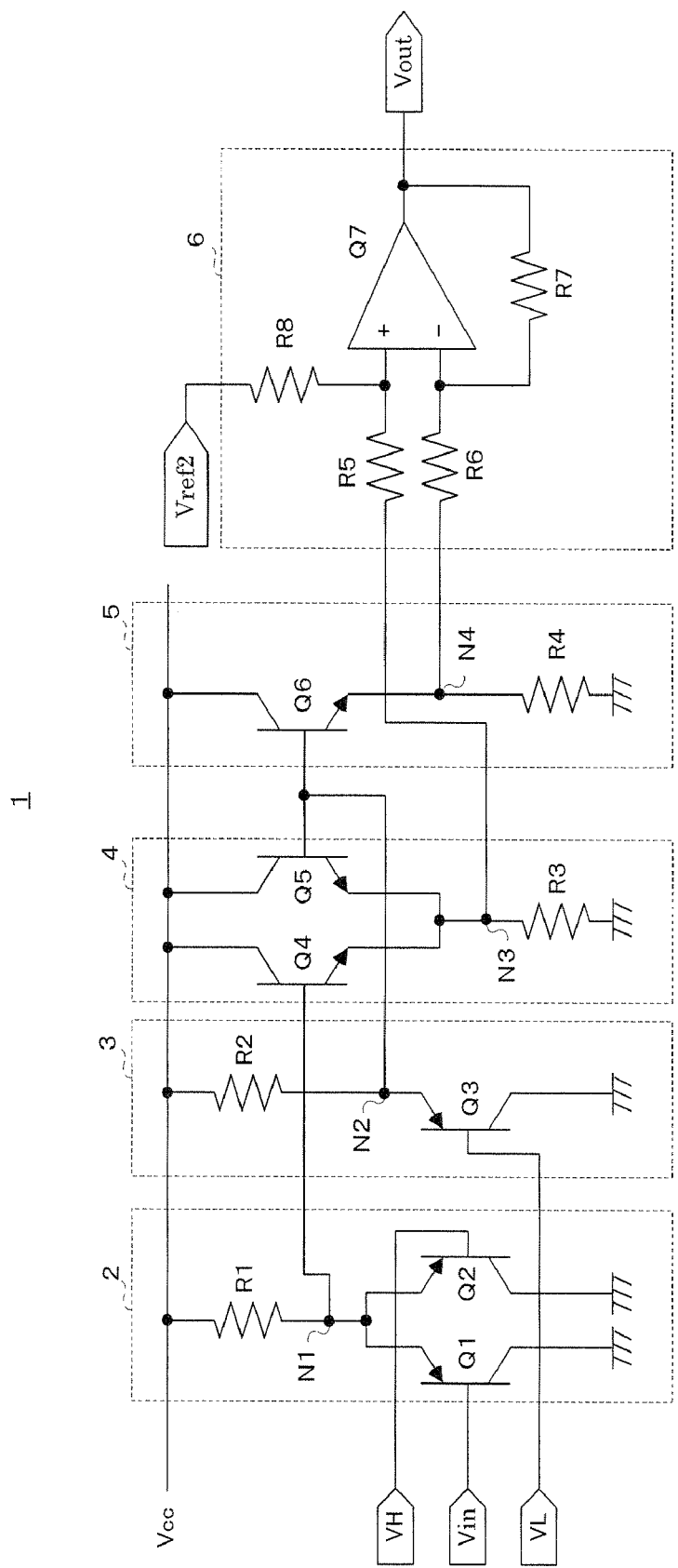
FIG. 1 is a circuit diagram showing a limiter circuit 1 according to Embodiment 1 of this invention.

1 . . . limiter circuit
2 . . . first switching circuit
3 . . . lower limit threshold correcting circuit
4 . . . second switching circuit
5 . . . potential correcting circuit
6 . . . adding and subtracting circuit
Q1, Q2, Q3 . . . PNP transistors
Q4, Q5, Q6 . . . NPN transistors
Q7 . . . differential amplifier
R1, R2, R3, R4, R5, R6, R7, R8 . . . resistors
N1, N2, N3, N4 . . . nodes

[Embodiment 1]

Embodiment 1 of this invention will be described in detail hereinafter with reference to the drawings.

FIG. 1 is a circuit diagram showing a limiter circuit according to Embodiment 1. The limiter circuit of this invention is formed, for example, in an IC, such as an input buffer amplifier of an analog-to-digital converter, or a signal processing circuit.

As shown in FIG. 1, a limiter circuit 1 in Embodiment 1 includes a switching circuit 2 for carrying out ON/OFF control in response to a magnitude relation between an input signal Vin and an upper limit threshold signal VH, a lower limit threshold correcting circuit 3 for correcting a potential increased with the switching control of the switching circuit 2 to a lower limit threshold signal VL, a switching circuit 4 for carrying out ON/OFF control in response to a magnitude relation between outputs of the switching circuit 2 and lower limit threshold correcting circuit 3, a potential correcting circuit 5 for correcting a potential decreased with the switching control of the switching circuit 4, and an adding and subtracting circuit 6 for carrying out differential amplification of outputs of the switching circuit 4 and potential correcting circuit 5. The input signal Vin corresponds to the input signal voltage in this invention. The upper limit threshold signal VH corresponds to the upper limit threshold signal voltage in this invention. The lower limit threshold signal VL corresponds to the lower limit threshold signal voltage in this invention. The switching circuit 2 corresponds to the upper limit limiter circuit in this invention.

The switching circuit 4 corresponds to the lower limit limiter circuit in this invention.

<Switching Circuit 2>

Next, the construction of the switching circuit 2 will be described.

Differential signals (input signal Vin and upper limit threshold signal VH) are inputted to a pair of PNP transistors Q1 and Q2. The base of PNP transistor Q1 is connected to the input signal Vin. The base of PNP transistor Q2 is connected to the upper limit threshold signal VH. The emitters of PNP transistors Q1 and Q2 are connected to a node N1, while the collectors are connected to ground voltage GND. A resistor R1 is connected between the node N1 and a positive voltage source Vcc, to function as a constant current source for limiting current flow to the PNP transistors Q1 and Q2. The resistor R1 corresponds to the first constant current generating device in this invention. The voltage source Vcc corresponds to the first common voltage in this invention. The ground voltage GND corresponds to the second common voltage in this invention.

Figure 2A:
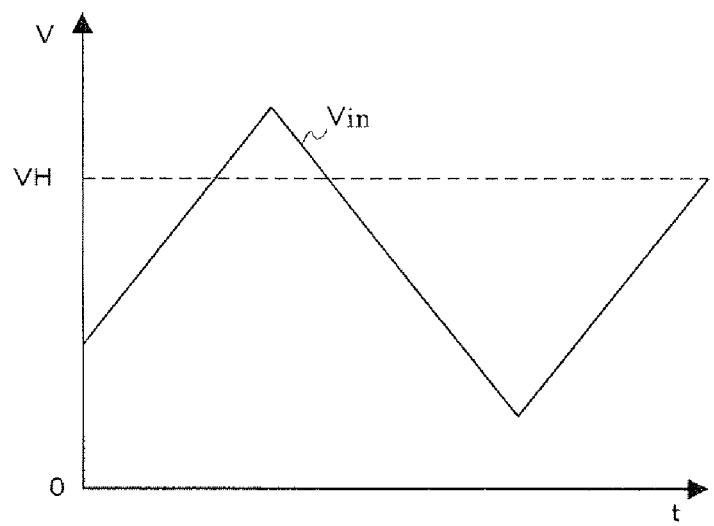
FIG. 2 is an explanatory view illustrating operation of a switching circuit 2 according to Embodiment 1 of this invention.

Operation of the switching circuit 2 will be described with reference to FIG. 2. FIG. 2(a) is a view showing a relationship between the input signal Vin and upper limit threshold signal VH inputted to the switching circuit 2. When the input signal Vin is lower than the upper limit threshold signal VH, or when Vin≦VH is formed, the PNP transistor Q1 carries out an emitter follower operation. That is, a switching operation takes place to turn on the PNP transistor Q1, and turn off the PNP transistor Q2. Potential Vn1 at node N1 becomes a potential having base-emitter voltage Vbep1 of the PNP transistor Q1 added to the input signal Vin.

$$Vn1=Vin+Vbep1 \ (Vin \leq VH) \qquad (1)$$

When the input signal Vin is higher than the upper limit threshold signal VH, or when Vin>VH is formed, the PNP transistor Q2 carries out an emitter follower operation. That is, a switching operation takes place to turn off the PNP transistor Q1, and turn on the PNP transistor Q2. Potential Vn1 at node N1 becomes a potential having base-emitter voltage Vbep2 of the PNP transistor Q2 added to the upper limit threshold signal VH.

$$Vn1=VH+Vbep2 \ (Vin>VH) \qquad (2)$$

Here, the base-emitter voltages Vbep1 and Vbep2 of PNP transistors Q1 and Q2 have substantially the same characteristics since the PNP transistors Q1 and Q2 are formed in the same IC.

$$Vbep1=Vbep2=Vbep \qquad (3)$$

from equation (1)-equation (3), $$Vn1=Vin+Vbep \ (Vin \leq VH) \qquad (4)$$

$$Vn1=VH+Vbep \ (Vin>VH) \qquad (5)$$

Figure 2B:
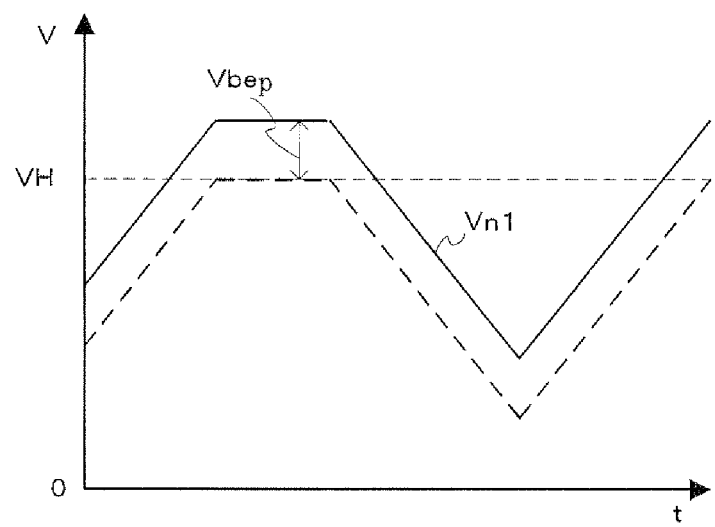

Thus, the switching circuit 2 carries out a comparison to check whether the input signal Vin inputted is larger or smaller than the upper limit threshold signal VH. And the PNP transistors Q1 and Q2 take switching action based on this comparison, and cut signal voltage components exceeding the upper limit threshold signal VH from the input signal Vin. At the same time, the input signal Vin with the upper limit cut off is increased by an amount corresponding to the base-emitter voltage Vbep of PNP transistors Q1 and Q2. In this way, potential Vn1 shown in FIG. 2(b) is outputted from the node N1. The potential Vn1 at the node N1 corresponds to the upper limit signal voltage in this invention.

<Lower Limit Threshold Correcting Circuit 3>

The construction of the lower limit threshold correcting circuit 3 will be described.

First, the lower limit threshold signal VL is inputted to the base of a PNP transistor Q3, with the emitter connected to a node N2 and the collector connected to ground voltage GND. A resistor R2 is connected between the node N2 and positive voltage source Vcc to function as a constant current source for limiting current flow to the PNP transistor Q3. The resistor R2 corresponds to the second constant current generating device in this invention.

Figure 3A:
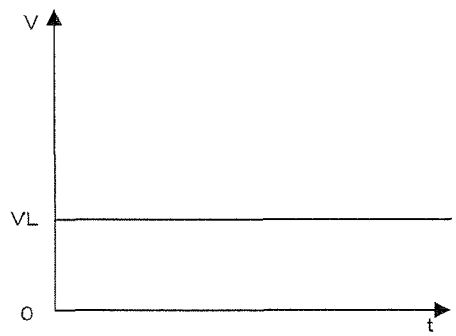
FIG. 3 is an explanatory view illustrating operation of a lower limit threshold correcting circuit 3 according to Embodiment 1 of this invention.
Figure 3B:
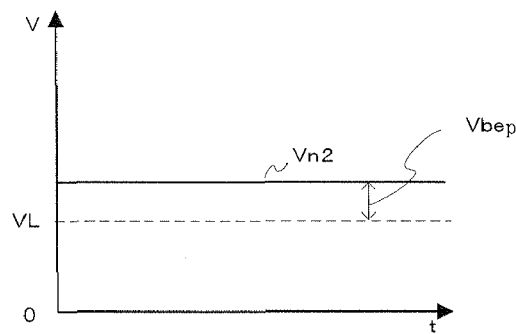

Next, operation of the lower limit threshold correcting circuit 3 will be described with reference to FIG. 3. Potential Vn2 at the node N2 is determined by the lower limit threshold signal VL shown in FIG. 3(a) and a base-emitter voltage Vbep3 of the PNP transistor Q3.

$$Vn2=VL+Vbep3 \qquad (6)$$

Here, the PNP transistor Q3 is also formed in the same IC as the PNP transistors Q1 and Q2, and therefore has substantially the same characteristics.

$$Vbep3=Vbep1=Vbep2=Vbep \qquad (7)$$

from equation (6) and equation (7), $$Vn2=VL+Vbep \qquad (8)$$

Figure 4A:
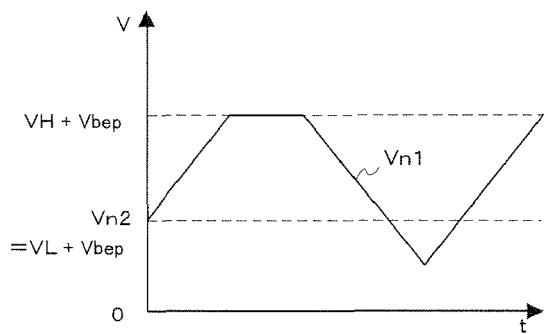
FIG. 4 is an explanatory view illustrating operation of a switching circuit 4 according to Embodiment 1 of this invention.
Figure 4B:
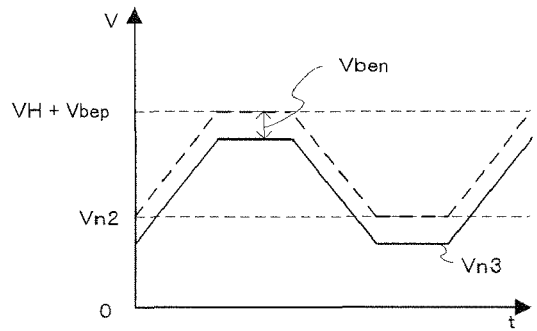

Thus, the lower limit threshold correcting circuit 3 corrects the lower limit threshold signal VL by increasing the lower limit threshold signal VL also by the same potential difference as the base-emitter voltage Vbep by which the input signal Vin was increased in the switching circuit 2. And the potential Vn2 corrected as shown in FIG. 4(b) is outputted from the node N2. The potential Vn2 at the node N2 corresponds to the lower limit threshold correction signal voltage in this invention.

<Switching Circuit 4>

The construction of the switching circuit 4 will be described.

Differential signals (potential Vn1 from the node N1 and potential Vn2 from the node N2) are inputted to a pair of NPN transistors Q4 and Q5. The base of NPN transistor Q4 is connected to the node N1. The base of NPN transistor Q5 is connected to the node N2. The emitters of NPN transistors Q4 and Q5 are connected to a node N3, while the collectors are connected to the positive voltage source Vcc. A resistor R3 is connected between the node N3 and ground voltage GND to function as a constant current source for limiting current flow to the NPN transistors Q4 and Q5. The resistor R3 corresponds to the third constant current generating device in this invention.

Next, operation of the switching circuit 4 will be described with reference to FIG. 4. When the potential Vn1 from the node N1 is higher than the potential Vn2 from the node N2, or when Vn1≧Vn2 is formed, the NPN transistor Q4 carries out an emitter follower operation. That is, a switching operation takes place to turn on the NPN transistor Q4 and turn off the NPN transistor Q5. Potential Vn3 at the node N3 becomes a potential by subtracting base-emitter voltage Vbep4 of the NPN transistor Q4 from the potential Vn1 of the node N1.

$$Vn3=Vn1-Vben4 \ (Vn1 \leq Vn2) \qquad (9)$$

When the potential Vn1 from the node N1 is lower than the potential Vn2 from the node N2, or when Vn1<Vn2 is formed, the NPN transistor Q5 carries out an emitter follower operation. That is, a switching operation takes place to turn off the NPN transistor Q4 and turn on the NPN transistor Q5. Potential Vn3 at node N3 becomes a potential by subtracting base-emitter voltage Vbep5 of the NPN transistor Q5 from the potential Vn2 of node N2.

$$Vn3=Vn2-Vben5 \ (Vn1<Vn2) \qquad (10)$$

Here, the base-emitter voltages Vben4 and Vben5 of NPN transistors Q4 and Q5 have substantially the same characteristics since the NPN transistors Q4 and Q5 are formed in the same IC.

$$Vben4=Vben5=Vben \qquad (11)$$

from equation (9)-equation (11), $$Vn3=Vn1-Vben \ (Vn1 \leq Vn2) \qquad (12)$$

$$Vn3=Vn2-Vben \ (Vn1<Vn2) \qquad (13)$$

Thus, the switching circuit 4 carries out a comparison to check whether the inputted potential Vn1 of node N1 is larger or smaller than the potential Vn2 of node N2 resulting from the correction of the lower limit threshold signal VL. And the NPN transistors Q4 and Q5 take switching action based on this comparison, and cut signal voltage components lower than the potential Vn2 from the potential Vn1 inputted. At the same time, it is decreased by an amount corresponding the base-emitter voltage Vben of the NPN transistors Q4 and Q5. In this way, potential Vn3 shown in FIG. 4(b) is outputted from the node N3. The potential Vn3 at the node N3 corresponds to the upper and lower limit signal voltage in this invention.

<Potential Correcting Circuit 5>

The construction of the potential correcting circuit 5 will be described.

The potential Vn2 of node N2 is inputted to the base of an NPN transistor Q6, with the emitter connected to a node N4, and the collector connected to the positive voltage source Vcc. A resistor R4 is connected between the node N4 and ground voltage GND to function as a constant current source for limiting current flow to the NPN transistor Q6. The resistor R4 corresponds to the fourth constant current generating device in this invention.

Figure 5A:
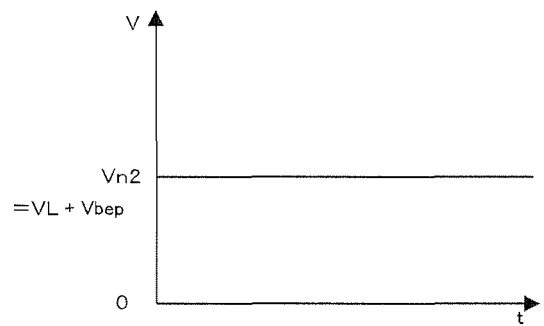
FIG. 5 is an explanatory view illustrating operation of a potential correcting circuit 5 according to Embodiment 1 of this invention.
Figure 5B:
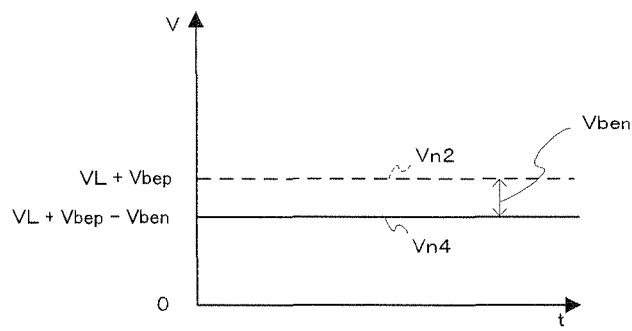

Next, operation of the potential correcting circuit 5 will be described with reference to FIG. 5. Potential Vn4 at the node N4 is determined by the potential Vn2 of node N2 shown in FIG. 5(a) and a base-emitter voltage Vben6 of the NPN transistor Q6.

$$Vn4=Vn2-Vben6 \quad (14)$$

Here, the NPN transistor Q6 is also formed in the same IC, and therefore has substantially the same characteristics.

$$Vben6=Vben4=Vben5=Vben \quad (15)$$

from equation (14) and equation (15), $$Vn4=Vn2-Vben \quad (16)$$

Thus, the potential correcting circuit 5 corrects the potential Vn2 by decreasing the potential Vn2 outputted from the node N2 also by the same potential difference as the base-emitter voltage Vben by which the potential Vn1 of node N1 was decreased in the switching circuit 4. And the potential Vn4 corrected as shown in FIG. 4(b) is outputted from the node N4. The potential Vn4 at the node N4 corresponds to the first reference signal voltage in this invention.

<Adding and Subtracting Circuit 6>

The construction of the adding and subtracting circuit 6 will be described.

The node N3 is connected to a positive input node of a differential amplifier Q7 through a resistor R5, while the node N4 is connected to a negative input node through a resistor R6. A reference voltage Vref2 is inputted to the positive input node through a resistor R8. The negative input node and an output node are connected through a resistor R7 to provide a negative feedback. The reference voltage Vref2 corresponds to the second reference signal voltage in this invention.

Figure 6A:
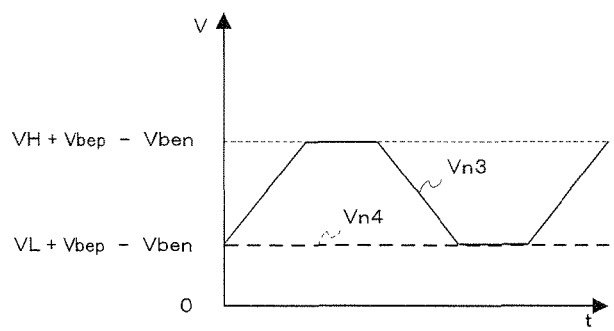
FIG. 6 is an explanatory view illustrating operation of an adding and subtracting circuit 6 according to Embodiment 1 of this invention.
Figure 6B:
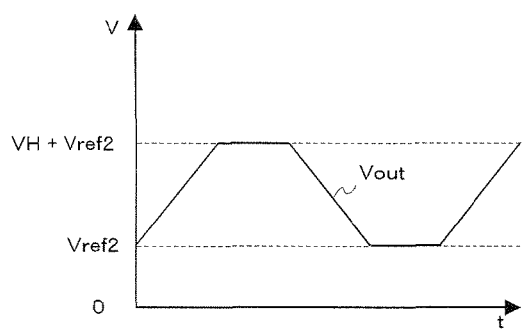

Output signal Vout of the differential amplifier Q7 is determined by the potential Vn3 of node N3 and the potential Vn4 of node N4 shown in FIG. 6(a), the reference voltage Vref2, and the resistors R5, R6, R7 and R8. The output signal Vout corresponds to the output signal voltage in this invention.

$$Vout=R5 \times R8/(R5+R8) \times (R6+R7)/R6 \times (Vn3/R5-Vn4/R6+Vref2/R8) \quad (17)$$

If $$R5=R6=R8=R \quad (18),$$

then $$Vout=\tfrac{1}{2} \times (1+R7/R) \times (Vn3-Vn4+Vref2) \quad (19)$$

The amplification factor by the differential amplifier Q7 is determined by a relationship between R and R7.

Further, if $$R7=R \quad (20),$$

then $$Vout=Vn3-Vn4+Vref2 \quad (21)$$

With the limiter circuit 1 according to this embodiment, output signal Vout when the input signal Vin is higher than the upper limit threshold signal VH (Vin>VH) is as follows from equation (5), equation (8), equation (12), equation (16) and equation (21):

$$\begin{aligned} Vout &= Vn3 - Vn4 + Vref2 \quad (22)\\ &= (Vn1 - Vben) - (Vn2 - Vben) + Vref2\\ &= (VH + Vbep - Vben) - (VL + Vbep - Vben) + Vref2\\ &= VH - VL + Vref2 \end{aligned}$$

When the input signal Vin is between the upper limit threshold signal VH and lower limit threshold signal VL (VL≦Vin≦VH), the following is formed from equation (4), equation (8), equation (12), equation (16) and equation (21):

$$\begin{aligned} Vout &= Vn3 - Vn4 + Vref2 \quad (23)\\ &= (Vn1 - Vben) - (Vn2 - Vben) + Vref2\\ &= (Vin + Vbep - Vben) - (VL + Vbep - Vben) + Vref2\\ &= Vin - VL + Vref2 \end{aligned}$$

When the input signal Vin is lower than the lower limit threshold signal VL (Vin<VL), the following is formed from equation (4), equation (8), equation (13) and equation (16):

$$\begin{aligned} Vout &= Vn3 - Vn4 + Vref2 \quad (24)\\ &= (Vn2 - Vben) - (Vn2 - Vben) + Vref2\\ &= Vref2 \end{aligned}$$

If $$Vref2=VL \quad (25),$$

when the input signal Vin is higher than the upper limit threshold signal VH (Vin>VH), $$Vout=VH \quad (26),$$

when the input signal Vin is between the upper limit threshold signal VH and lower limit threshold signal VL (VL≦Vin≦VH), $$Vout=Vin \quad (27)$$

and when the input signal Vin is lower than the lower limit threshold signal VL (Vin<VL), $$Vout=VL \quad (28),$$

thereby realizing a limit operation. When Vref2 has a constant value, as shown in FIG. 6(d), the lower limit of the output signal Vout becomes the value of Vref2.

Thus, the adding and subtracting circuit 6 subtracts the potential Vn4 of node N4 inputted to the negative input node from the potential Vn3 of node N3 inputted to the positive input node, and adds the reference voltage Vref2. As a result, voltage components higher than the upper limit threshold signal VH and voltage components lower than the lower limit threshold signal VL can be removed from the input signal Vin, and a voltage signal with a lower limit corresponding to the reference voltage Vref2 can be outputted.

Figure 7A:
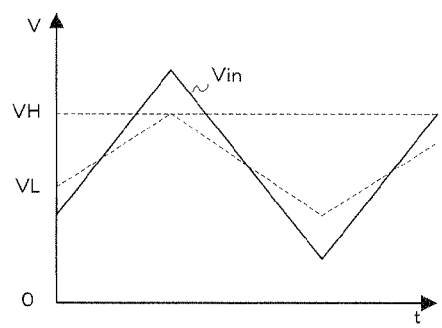
FIG. 7 is an explanatory view illustrating operation of the limiter circuit 1 at a time of varying with time a lower limit threshold signal according to Embodiment 1 of this invention.

Next, operation of the limiter circuit according to this embodiment when the lower limit threshold signal VL varies with time will be described with reference to FIG. 7. As shown in FIG. 7(a), the lower limit threshold signal VL varies with time relative to the input signal Vin.

Figure 7B:
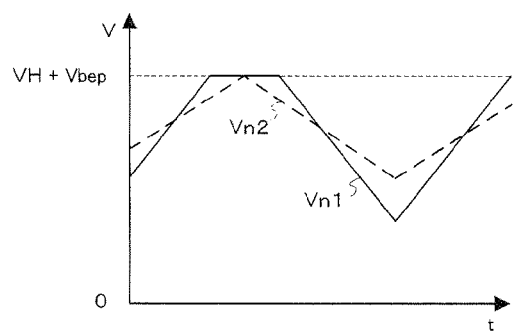

In this case also, the switching circuit 2 cuts signal voltage components exceeding the upper limit threshold signal VH from the input signal Vin. At the same time, the input signal Vin with the upper limit cut off is increased by an amount corresponding to the base-emitter voltage Vbep of the PNP transistors Q1 and Q2. As a result, potential Vn1 shown in FIG. 7(b) is outputted from the node N1. Similarly, the lower limit threshold correcting circuit 3 carries out a correction to increase the lower limit threshold signal VL by an amount corresponding to the base-emitter voltage Vbep of the PNP transistor Q3, and outputs potential Vn2 from the node N2.

Figure 7C:
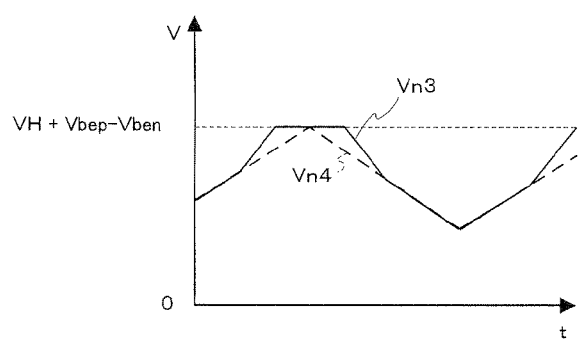

And the switching circuit 4 cuts signal voltage components lower than the potential Vn2 from the potential Vn1. At the same time, the voltage is decreased by an amount corresponding to the base-emitter voltage Vben of the NPN transistors Q4 and Q5. In this way, potential Vn3 shown in FIG. 7(c) is outputted from the node N3. Similarly, the potential correcting circuit 4 carries out a correction to decrease the potential Vn2 by an amount corresponding to the base-emitter voltage Vben of the NPN transistor Q6, and outputs Vn4 from the node N4.

Figure 7D:
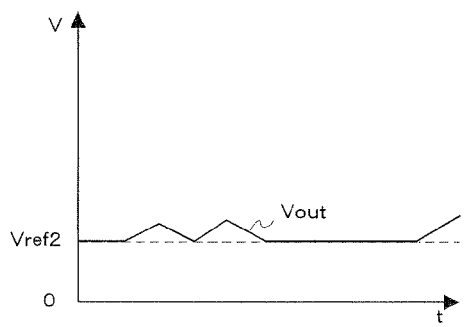

The adding and subtracting circuit 6 subtracts the potential Vn4 of node N4 inputted to the negative input node from the potential Vn3 of node N3 inputted to the positive input node, and adds the reference voltage Vref2. As a result, also in the case where the lower limit threshold signal VL varies with time, as shown in FIG. 7(d), a voltage signal after the removal of voltage components higher than the upper limit threshold signal VH and voltage components lower than the lower limit threshold signal VL from the input signal Vin can be outputted. The lower limit of output signal Vout is Vref2, which realizes a limit operation not influenced by the temporal variation of the lower limit threshold signal VL.

In the limiter circuit 1 constructed as described above, a pair of PNP transistors or NPN transistors carry out comparisons between the input signal voltage and threshold signal voltages and line switching at the same time. Therefore, compared with a circuit which carries out comparison using comparators, there is no influence of propagation delay and no switching noise occurs at times of line switching.

Since the PNP transistors and NPN transistors used in the circuit of Embodiment 1 can be arranged close together in the same chip, the limiter circuit can be made to have little variation in characteristics and to be highly precise. Since the application frequency band of limit operation depends on the frequency characteristics of the transistors used, a limit operation with signals with a high-speed frequency of several MHz or more, for example, can be realized easily by using high-speed transistors.

The limiter circuit in Embodiment 1 removes variations of the lower limit even when a dynamic lower limit threshold signal varying with time is inputted, thereby being capable of outputting an output signal with a constant lower limit.

Since both the signal voltages inputted to the positive and negative input nodes of the adding and subtracting circuit are inputted through the same number of stages, no time lag occurs between the two signal voltages. Consequently, there is no need to carry out a delay process of a signal voltage, and the limiter circuit with a simple circuit construction can be formed.

The limiter circuit in Embodiment 1 automatically corrects, in the lower limit threshold correcting circuit 3 and potential correcting circuit 5, the voltage increase and decrease by the base-emitter voltages of the PNP transistors and NPN transistors. Therefore, the limiter circuit 1 is operable also when the values of the base-emitter voltages of the PNP transistors and NPN transistors are unknown.

[Embodiment 2]

Next, Embodiment 2 of this invention will be described in detail with reference to FIGS. 8 and 9.

Figure 8:
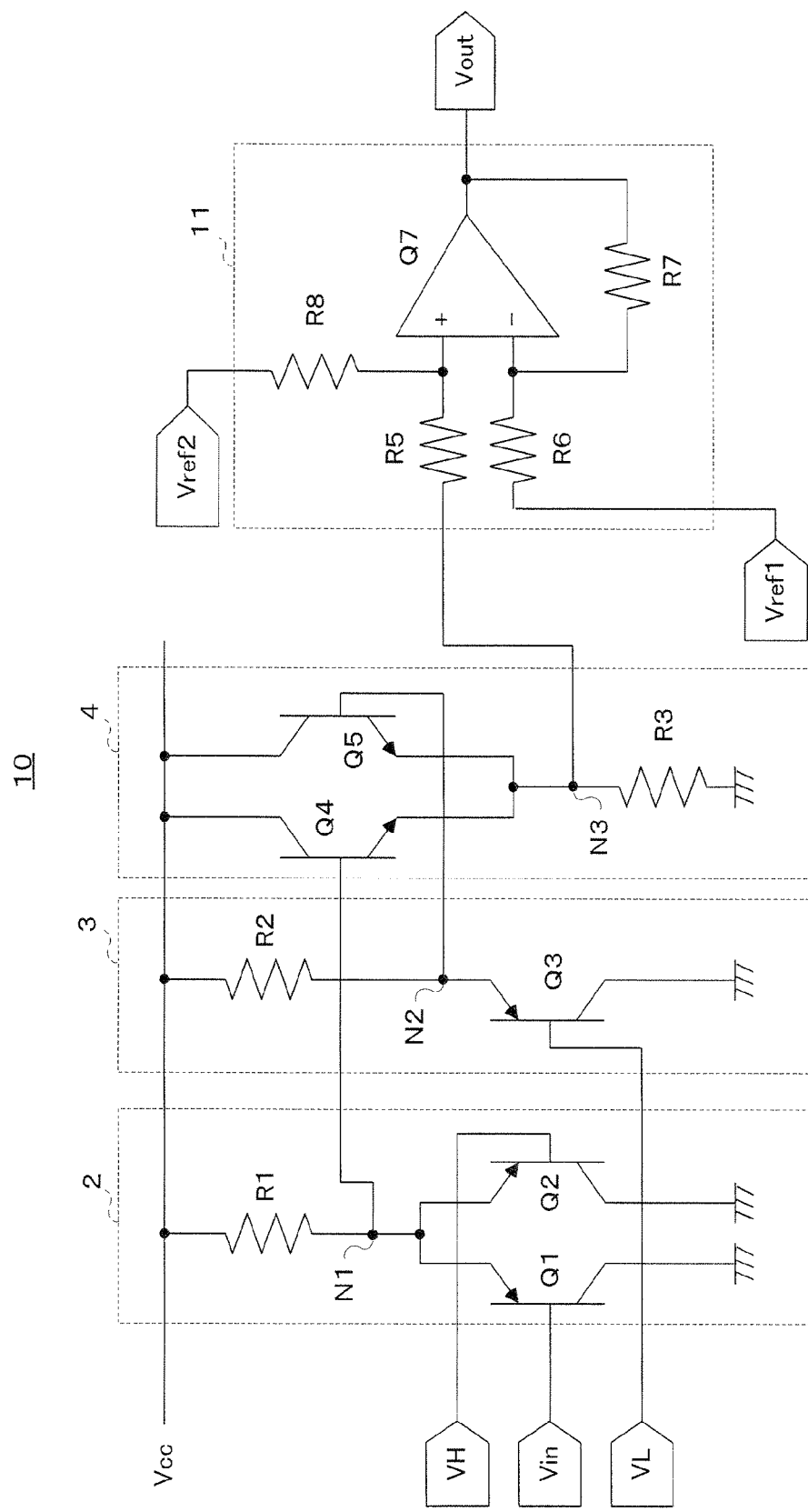
FIG. 8 is a circuit diagram showing a limiter circuit 10 according to Embodiment 2 of this invention.

FIG. 8 is a circuit diagram showing a limiter circuit according to Embodiment 2. FIG. 9 is an explanatory view illustrating operation of the limiter circuit according to Embodiment 2.

As shown in FIG. 8, a limiter circuit 10 in Embodiment 2 includes a switching circuit 2 for carrying out ON/OFF control in response to a magnitude relation between an input signal Vin and an upper limit threshold signal VH, a lower limit threshold correcting circuit 3 for generating a potential for correcting a potential increased with the switching control of the switching circuit 2 to a lower limit threshold signal VL, a switching circuit 4 for carrying out ON/OFF control in response to a magnitude relation between outputs of the switching circuit 2 and lower limit threshold correcting circuit 3, and an adding and subtracting circuit 11 for carrying out differential amplification of output of the switching circuit 4 and a reference voltage Vref1.

The limiter circuit 10 in Embodiment 2 is a circuit which dispenses with the potential correcting circuit 5 of the limiter circuit 1 in Embodiment 1, and employs the reference voltage Vref1 instead. Consequently, the constructions and operations of the switching circuit 2, lower limit threshold correcting circuit 3 and switching circuit 4 of the limiter circuit 10 in Embodiment 2 are the same as in Embodiment 1, and will not be described.

Next, the construction of the adding and subtracting circuit 11 will be described.

The node N3 is connected to a positive input node of a differential amplifier Q7 through a resistor R5. The reference voltage Vref2 is connected to the positive input node through a resistor R8, and the reference voltage Vref1 is inputted to a negative input node through a resistor R6. The negative input node and an output node are connected through a resistor R7 to provide a negative feedback. The reference voltage Vref1 corresponds to the first reference signal voltage in this invention. The reference voltage Vref2 corresponds to the second reference signal voltage in this invention.

Output signal Vout of the differential amplifier Q7 is determined by the potential Vn3 of node N3, the reference voltages Vref1 and Vref2, and the resistors R5, R6, R7 and R8.

$$Vout = R5 \times R8/(R5+R8) \times (R6+R7)/R6 \cdot (Vn3/R5 - Vref1/R6 + Vref2/R8) \quad (29)$$

If $$R5 = R6 = R8 = R \quad (30),$$

then $$Vout = \frac{1}{2} \times (1 + R7/R) \times (Vn3 - Vref1 + Vref2) \quad (31)$$

The amplification factor by the differential amplifier Q7 is determined by a relationship between R and R7.

Further, if $$R7 = R \tag{32}$$

then $$Vout = Vn3 - Vref1 + Vref2 \tag{33}$$

Operation of the limiter circuit 10 according to Embodiment 2 will be described with reference to FIG. 9.

Figure 9A:
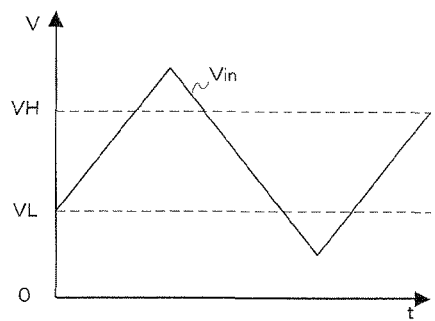
FIG. 9 is an explanatory view illustrating operation of the limiter circuit 10 according to Embodiment 2 of this invention.
Figure 9B:
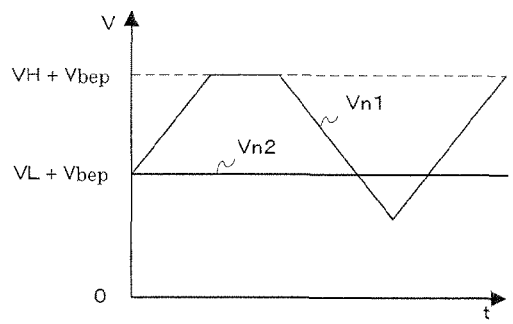
Figure 9C:
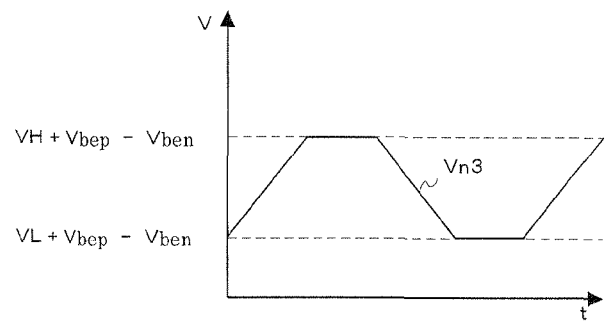

FIG. 9(a) shows a relationship between the input signal Vin, upper limit threshold signal VH and lower limit threshold signal VL inputted to the limiter circuit 10. As shown in FIG. 9(b), the switching circuit 2 cuts components of the input signal Vin exceeding the upper limit threshold signal VH, increases it by an amount corresponding to the base-emitter voltage Vbep of PNP transistors Q1 and Q2, and outputs potential Vn1 from the node N1. The lower limit threshold correcting circuit 3 increases the lower limit threshold signal VL also by the same potential difference as the base-emitter voltage Vbep by which the input signal Vin was increased in the switching circuit 2. Consequently, the potential Vn2 resulting from the correction of the lower limit threshold signal VL is outputted from the node N2. As shown in FIG. 9(c), the switching circuit 4 cuts signal voltage components lower than the potential Vn2 from the potential Vn1, and further outputs from the node N3 the potential Vn3 decreased by an amount corresponding the base-emitter voltage Vben of NPN transistors Q4 and Q5.

The output signal Vout outputted from the adding and subtracting circuit 11 when the input signal Vin is higher than the upper limit threshold signal VH (Vin>VH) is as follows:

$$\begin{aligned} Vout &= Vn3 - Vref1 + Vref2 \\ &= (Vn1 - Vben) - Vref1 + Vref2 \\ &= (VH + Vbep - Vben) - Vref1 + Vref2 \end{aligned} \tag{34}$$

When the input signal Vin is between the upper limit threshold signal VH and lower limit threshold signal VL (VL≦Vin≦VH), the following is formed:

$$\begin{aligned} Vout &= Vn3 - Vref1 + Vref2 \\ &= (Vn1 - Vben) - Vref1 + Vref2 \\ &= (Vin + Vbep - Vben) - Vref1 + Vref2 \end{aligned} \tag{35}$$

When the input signal Vin is lower than the lower limit threshold signal VL (Vin<VL), the following is formed:

$$\begin{aligned} Vout &= Vn3 - Vref1 + Vref2 \\ &= (Vn2 - Vben) - Vref1 + Vref2 \\ &= (VL + Vbep - Vben) - Vref1 + Vref2 \end{aligned} \tag{36}$$

Figure 9D:
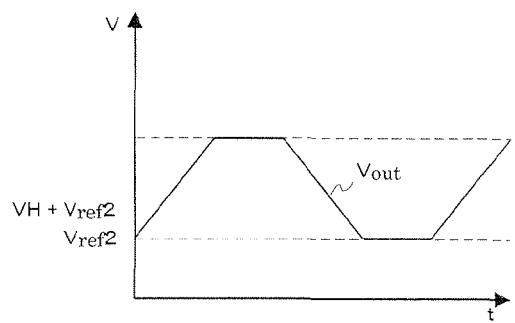

If $$Vref1 = Vbep - Vben \tag{37}$$

and $$Vref2 = 0 \tag{38},$$

when the input signal Vin is higher than the upper limit threshold signal VH (Vin>VH), $$Vout = VH \tag{39},$$

when the input signal Vin is between the upper limit threshold signal VH and lower limit threshold signal VL (VL≦Vin≦VH), $$Vout = Vin \tag{40}$$

and when the input signal Vin is lower than the lower limit threshold signal VL (Vin<VL), $$Vout = VL \tag{41},$$

thereby realizing a limit operation. When Vref2 has a constant value, the lower limit of the output signal Vout becomes the value of Vref2 as shown in FIG. 9(d).

Moreover, when $$Vbep = Vben \tag{42}$$

is formed, and if $$Vref1 = Vref2 = 0 \tag{43},$$

and when the input signal Vin is higher than the upper limit threshold signal VH (Vin>VH), $$Vout = VH \tag{44}.$$

When the input signal Vin is between the upper limit threshold signal VH and lower limit threshold signal VL (VL≦Vin≦VH), $$Vout = Vin \tag{45}.$$

When the input signal Vin is lower than the lower limit threshold signal VL (Vin<VL), $$Vout = VL \tag{46}.$$

Also when the lower limit threshold signal VL dynamically varies with time, the lower limit of the output signal Vout of the adding and subtracting circuit 9 is as follows:

$$VL + Vbep - Vben - Vref1 + Vref2 \tag{47}$$

For example, with $$Vref1 = VL + Vbep - Vben \tag{48}$$

the lower limit of the output signal Vout is determined by Vref2, which realizes a limit operation not influenced by the lower limit threshold signal VL.

In the limiter circuit 10 constructed as described above, a pair of PNP transistors or NPN transistors carry out comparisons between the input signal voltage and threshold signal voltages and line switching at the same time. Therefore, compared with a circuit which carries out comparison using comparators, there is no influence of propagation delay and no switching noise occurs at times of line switching.

Since the PNP transistors and NPN transistors used in the circuit of Embodiment 2 can be arranged close together in the same chip, the limiter circuit can be made to have little variation in characteristics and to be highly precise. Since the application frequency band of limit operation depends on the frequency characteristics of the transistors used, a limit operation with signals with a high-speed frequency of several MHz or more, for example, can be realized easily by using high-speed transistors.

The limiter circuit 10 in Embodiment 2 removes variations of the lower limit even when a dynamic lower limit threshold signal varying with time is inputted, thereby being capable of outputting an output signal with a constant lower limit.

[Embodiment 3]

Figure 10:
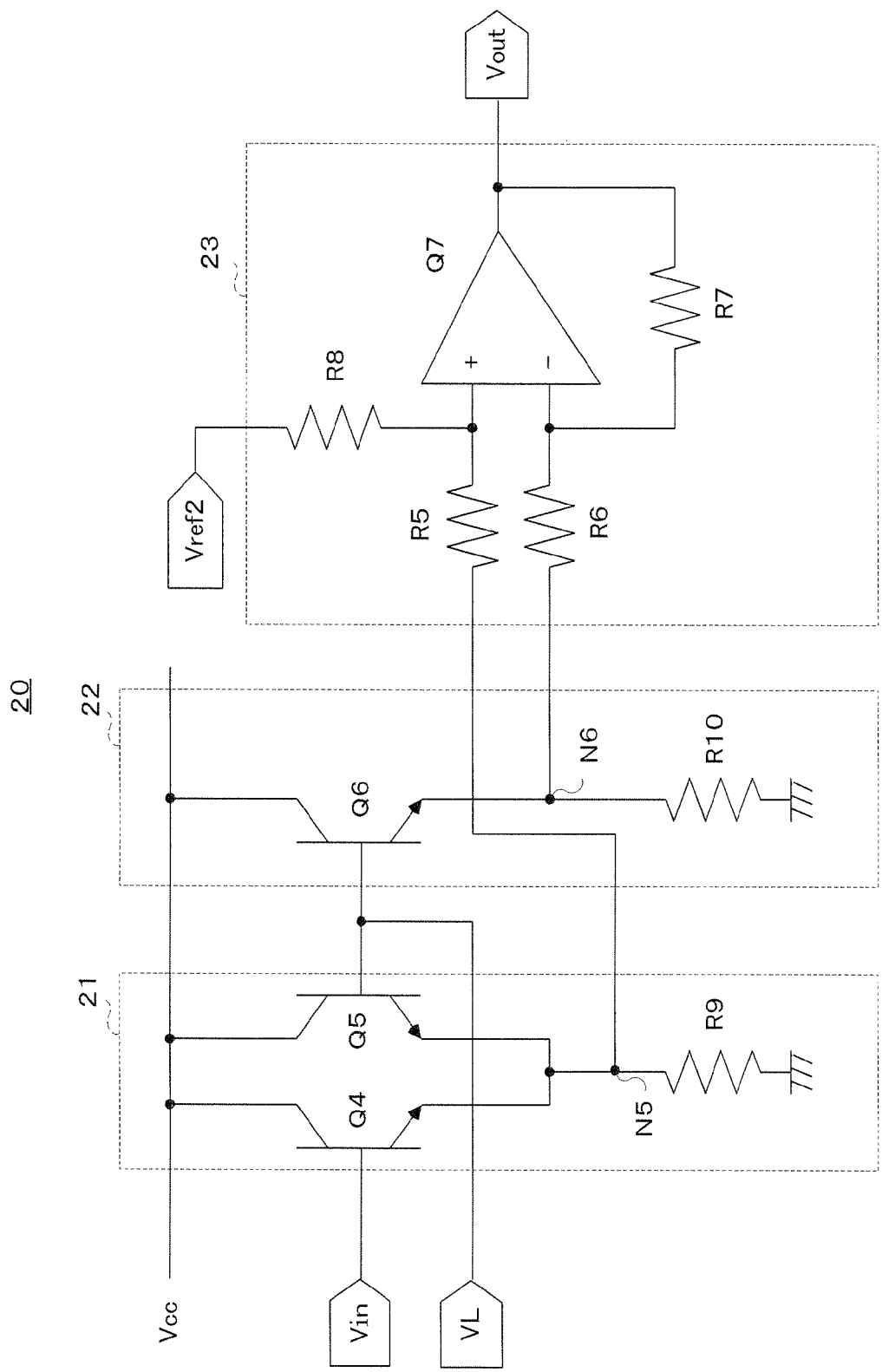
FIG. 10 is a circuit diagram showing a limiter circuit 20 according to Embodiment 3 of this invention.
Figure 11A:
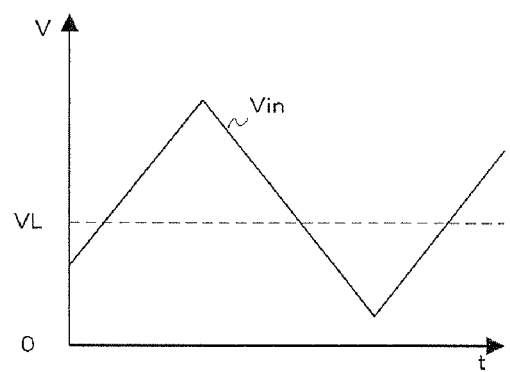
FIG. 11 is an explanatory view illustrating operation of the limiter circuit 20 according to Embodiment 3 of this invention.
Figure 11B:
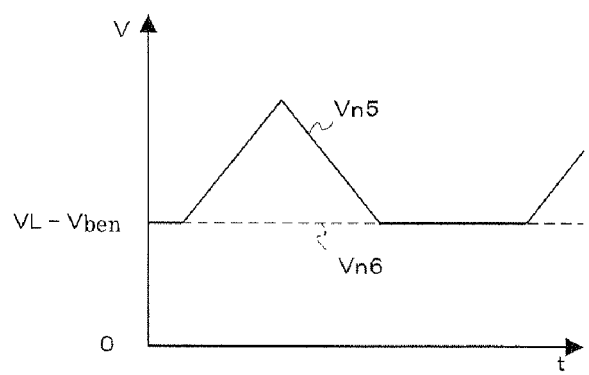
Figure 11C:
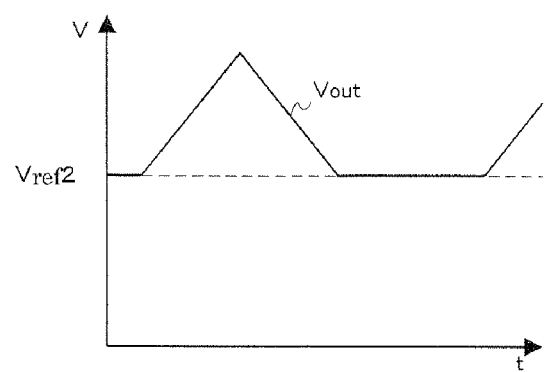

Next, Embodiment 3 of this invention will be described in detail with reference to FIGS. 10 and 11. FIG. 10 is a circuit diagram showing a limiter circuit according to Embodiment 3. FIG. 11 is an explanatory view illustrating operation of the limiter circuit according to Embodiment 3.

A limiter circuit 20 in Embodiment 3 includes a switching circuit 21 for carrying out ON/OFF control in response to a magnitude relation between an input signal Vin and a lower limit threshold signal VL, a potential correcting circuit 22 for correcting a potential decreased by the switching circuit 21, and an adding and subtracting circuit 23 for carrying out differential amplification of outputs of the switching circuit 21 and potential correcting circuit 21. The switching circuit 21 corresponds to the lower limit limiter circuit in this invention.

The limiter circuit 20 in Embodiment 3 carries out only a lower limit operation, and is a circuit omitting the switching circuit 2 and lower limit threshold correcting circuit 3 from the limiter circuit 1 in Embodiment 1.

Next, the construction of the switching circuit 21 will be described.

Differential signals (input signal Vin and lower limit threshold signal VL) are inputted to a pair of NPN transistors Q4 and Q5. The base of NPN transistor Q4 is connected to the input signal Vin. The base of NPN transistor Q5 is connected to the lower limit threshold signal VL. The emitters of NPN transistors Q4 and Q5 are connected to a node N5, while the collectors are connected to a positive voltage source Vcc. A resistor R9 is connected between the node N5 and ground voltage GND to function as a constant current source for limiting current flow to the NPN transistors Q4 and Q5. The resistor R9 corresponds to the first constant current generating device in this invention. The ground voltage GND corresponds to the second common voltage in this invention.

Next, operation of the switching circuit 21 will be described with reference to FIG. 11. When the input signal Vin is higher than the lower limit threshold signal VL, or when Vin VL is formed, the NPN transistor Q4 carries out an emitter follower operation. That is, a switching operation takes place to turn on the NPN transistor Q4 and turn off the NPN transistor Q5. Potential Vn5 at node N5 becomes a potential by subtracting base-emitter voltage Vben4 of the NPN transistor Q4 from the input signal Vin.

$$Vn5 = Vin - Vben4 \ (Vin \geq VL) \tag{49}$$

When the input signal Vin is lower than the lower limit threshold signal VL, or when Vin<VL is formed, the NPN transistor Q5 carries out an emitter follower operation. That is, a switching operation takes place to turn off the NPN transistor Q4 and turn on the NPN transistor Q5. Potential Vn5 at node N5 becomes a potential by subtracting base-emitter voltage Vben5 of the NPN transistor Q5 from the lower limit threshold signal VL.

$$Vn5 = VL - Vben5 \ (Vin<VL) \tag{50}$$

Here, the base-emitter voltages Vbep4 and Vbep5 of NPN transistors Q4 and Q5 have substantially the same characteristics since the NPN transistors Q4 and Q5 are formed in the same IC.

$$Vben4 = Vben5 = Vben \tag{51}$$

from equation (49)-equation (51), $$Vn5 = Vin - Vben \ (Vin \geq VL) \tag{52}$$

$$Vn5 = VL - Vben \ (Vin<VL) \tag{53}$$

Thus, the switching circuit 21 carries out a comparison to check whether the input signal Vin inputted is larger or smaller than the lower limit threshold signal VL. And the NPN transistors Q4 and Q5 take switching action based on this comparison, and cut signal voltage components lower than the lower limit threshold signal VL from the input signal Vin. At the same time, it is decreased by an amount corresponding the base-emitter voltage Vben of NPN transistors Q4 and Q5. In this way, potential Vn5 shown in FIG. 11(b) is outputted from the node N5. The potential Vn5 at the node N5 corresponds to the lower limit signal voltage in this invention.

Next, the construction of the potential correcting circuit 22 will be described.

The lower limit threshold signal VL is inputted to the base of an NPN transistor Q6, with the emitter connected to a node N6, and the collector connected to the positive voltage source Vcc. A resistor R6 is connected between the node N6 and ground voltage GND, and functions as a constant current source for limiting current flow to the NPN transistor Q6. The resistor R6 corresponds to the second constant current generating device in this invention.

Potential Vn6 at the node N6 is determined by the lower limit threshold signal VL and a base-emitter voltage Vben6 of the NPN transistor Q6.

$$Vn6 = VL - Vben6 \tag{54}$$

Here, the NPN transistor Q6 is also formed in the same IC, and therefore has substantially the same characteristics.

$$Vben6 = Vben4 = Vben5 = Vben \tag{55}$$

from equation (54) and equation (55), $$Vn6 = VL - Vben \tag{56}$$

Thus, the potential correcting circuit 22 corrects the lower limit threshold signal VL by decreasing the lower limit threshold signal VL also by the same potential difference as the base-emitter voltage Vben by which the input signal Vin was decreased in the switching circuit 21. And the potential Vn6 corrected as shown in FIG. 11(b) is outputted from the node N6. The potential Vn6 at the node N6 corresponds to the first reference signal voltage in this invention.

Next, the construction of the adding and subtracting circuit 23 will be described.

The node N5 is connected to a positive input node of a differential amplifier Q7 through a resistor R5, while the node N6 is connected to a negative input node through a resistor R6. A reference voltage Vref2 is connected to the positive input node through a resistor R8. The negative input node and an output node are connected through a resistor R7 to provide a negative feedback. The reference voltage Vref2 corresponds to the second reference signal voltage in this invention. Output signal Vout of the differential amplifier Q7 is determined by the potential Vn5 of node N5 and the potential Vn6 of node N6, the reference voltage Vref2, and the resistors R5, R6, R7 and R8.

$$Vout = R5 \times R8/(R5+R8) \times (R6+R7)/R6 \times (Vn5/R5 - Vn6/R6 + Vref2/R8) \tag{57}$$

If $$R5 = R6 = R8 = R \tag{58},$$

then $$Vout = \tfrac{1}{2} \times (1+R7/R) \times (Vn5 - Vn6 + Vref2) \tag{59}$$

The amplification factor is determined by a relationship between R and R7.

Further, if $$R7 = R \tag{60},$$

then $$Vout = Vn5 - Vn6 + Vref2 \tag{61}$$

Next, operation of the limiter circuit 20 according to Embodiment 3 will be described.

When the input signal Vin is higher than the lower limit threshold signal VL (Vin≧VL), the following is formed:

$$Vout = Vn5 - Vn6 + Vref2 \qquad (62)$$
$$= (Vin - Vben) - (VL - Vben) + Vref2$$
$$= Vin - VL + Vref2$$

When the input signal Vin is lower than the lower limit threshold signal VL (Vin<VL), the following is formed:

$$Vout = Vn5 - Vn6 + Vref2 \qquad (63)$$
$$= (VL - Vben) - (VL - Vben) + Vref2$$
$$= Vref2$$

That is, the output signal shown in FIG. 11(*c*) will result. If $$Vref2 = VL \qquad (64)$$

and when the input signal Vin is higher than the lower limit threshold signal VL, the following is formed:

$$Vout = Vin \ (Vin \geq VL) \qquad (65)$$

and when the input signal Vin is lower than the lower limit threshold signal VL, $$Vout = VL \ (Vin < VL) \qquad (66),$$

thereby realizing a limit operation.

Thus, the adding and subtracting circuit 23 subtracts the potential Vn6 of node N6 inputted to the negative input node from the potential Vn5 of node N5 inputted to the positive input node, and adds the reference voltage Vref2. As a result, voltage components lower than the lower limit threshold signal VL can be removed from the input signal Vin, and a voltage signal with a lower limit corresponding to the reference voltage Vref2 can be outputted.

Figure 12A:
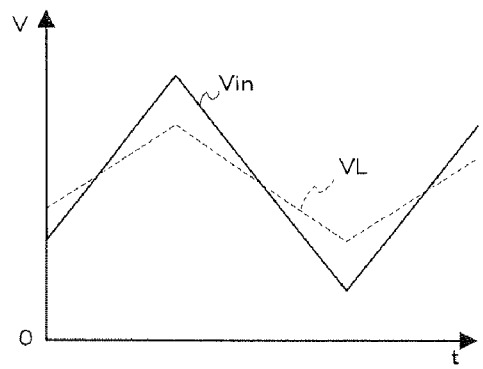
FIG. 12 is an explanatory view illustrating operation of the limiter circuit 20 at a time of varying with time a lower limit threshold signal according to Embodiment 3 of this invention.
Figure 12B:
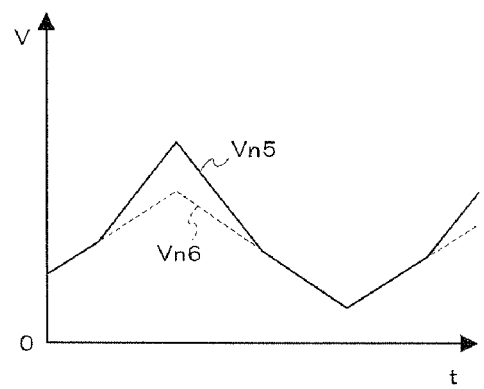
Figure 12C:
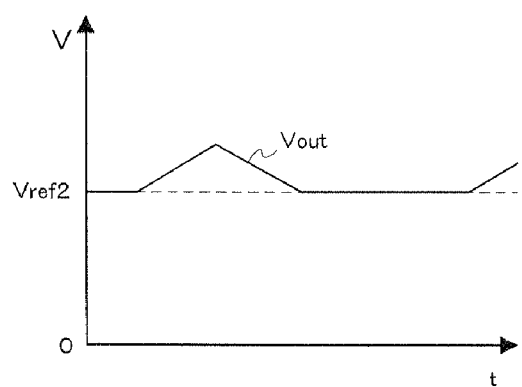

Next, operation of the limiter circuit 20 according to Embodiment 3 when the lower limit threshold signal VL dynamically varies with time will be described with reference to FIG. 12. As shown in FIG. 12(*a*), the lower limit threshold signal VL varies with time relative to the input signal Vin.

In this case also, the switching circuit 21 cuts signal voltage components lower than the lower limit threshold signal VL from the input signal Vin. At the same time, the voltage is decreased by an amount corresponding to the base-emitter voltage Vben of the NPN transistors Q4 and Q5. In this way, potential Vn5 shown in FIG. 12(*c*) is outputted from the node N5. Similarly, the potential correcting circuit 4 outputs from the node N6 the potential Vn6 resulting from the correction to decrease the lower limit threshold signal VL by an amount corresponding to the base-emitter voltage Vben of the NPN transistor Q6.

The adding and subtracting circuit 23 subtracts the potential Vn6 of node N6 inputted to the negative input node from the potential Vn5 of node N5 inputted to the positive input node, and adds the reference voltage Vref2. As a result, also in the case where the lower limit threshold signal VL varies with time, as shown in FIG. 12(*c*), a voltage signal after removal of voltage components lower than the lower limit threshold signal VL from the input signal Vin can be outputted. The lower limit of output signal Vout is Vref2, which realizes a limit operation not influenced by the lower limit threshold signal VL.

In the limiter circuit 20 constructed as described above, a pair of NPN transistors carry out comparisons between the input signal voltage and threshold signal voltages and line switching at the same time. Therefore, compared with a circuit which carries out comparison using comparators, there is no influence of propagation delay and no switching noise occurs at times of line switching.

Since the NPN transistors used in the limiter circuit 20 of Embodiment 3 can be arranged close together in the same chip, the limiter circuit can be made to have little variation in characteristics and to be highly precise. Since the application frequency band of limit operation depends on the frequency characteristics of the transistors used, a limit operation with signals with a high-speed frequency of several MHz or more, such as video signals, for example, can be realized easily by using high-speed transistors.

The limiter circuit 20 in Embodiment 3 removes variations of the lower limit even when a dynamic lower limit threshold signal varying with time is inputted, thereby being capable of outputting an output signal with a constant lower limit.

Since both the signal voltages inputted to the positive and negative input nodes of the adding and subtracting circuit are inputted through the same number of stages, no time lag occurs between the two signal voltages. Consequently, there is no need to carry out a delay process of a signal voltage, the limiter circuit with a simple circuit construction can be formed.

The limiter circuit 20 in Embodiment 3 automatically corrects, in the potential correcting circuit 22, the voltage decrease by the base-emitter voltage of the NPN transistors. Therefore, the limiter circuit 20 is operable also when the value of the base-emitter voltage of the NPN transistors is unknown.

In the limiter circuits according to Embodiments 1-3 described hereinbefore, the lower limit of the output signal Vout outputted from the limiter circuits is determined by Vref2. Thus, a level shift of the output signal Vout can be carried out at the same time by adjusting Vref2. Consequently, even when the output signal Vout is connected to an analog-to-digital converter of single power source, the limiter circuit can carry out a limit operation and level shift for the input signal Vin for adjustment to the input range of the analog-to-digital converter. When ground voltage GND is given as Vref2, the lower limit of output signal Vout will become ground voltage GND.

Only elements that can be constructed in a standard semiconductor process are used in Embodiments 1-3. Since the number of elements used is relatively small, a low occupying area is realizable, and the limiter circuit can be made at low cost. This can be realized easily in a standard process for semiconductor integrated circuits, and speed-up can be realized easily. Since it is realizable only by adding relatively simple elements to the adding and subtracting circuit, miniaturization of ICs can be achieved easily.

This invention is not limited to the foregoing embodiments, but may be modified as follows:

(1) Embodiment 1 described hereinbefore shows the construction of an upper and lower limit limiter circuit which gives a constant lower limit to the output signal Vout when outputting a lower limit threshold signal which is fixed or varies with time. On the other hand, according to the construction of a limit circuit 30 shown in FIG. 13, an upper and lower limit limiter circuit may be modified to give a constant upper limit to the output signal Vout when outputting an upper limit threshold signal which is fixed or varies with time.

Figure 13:
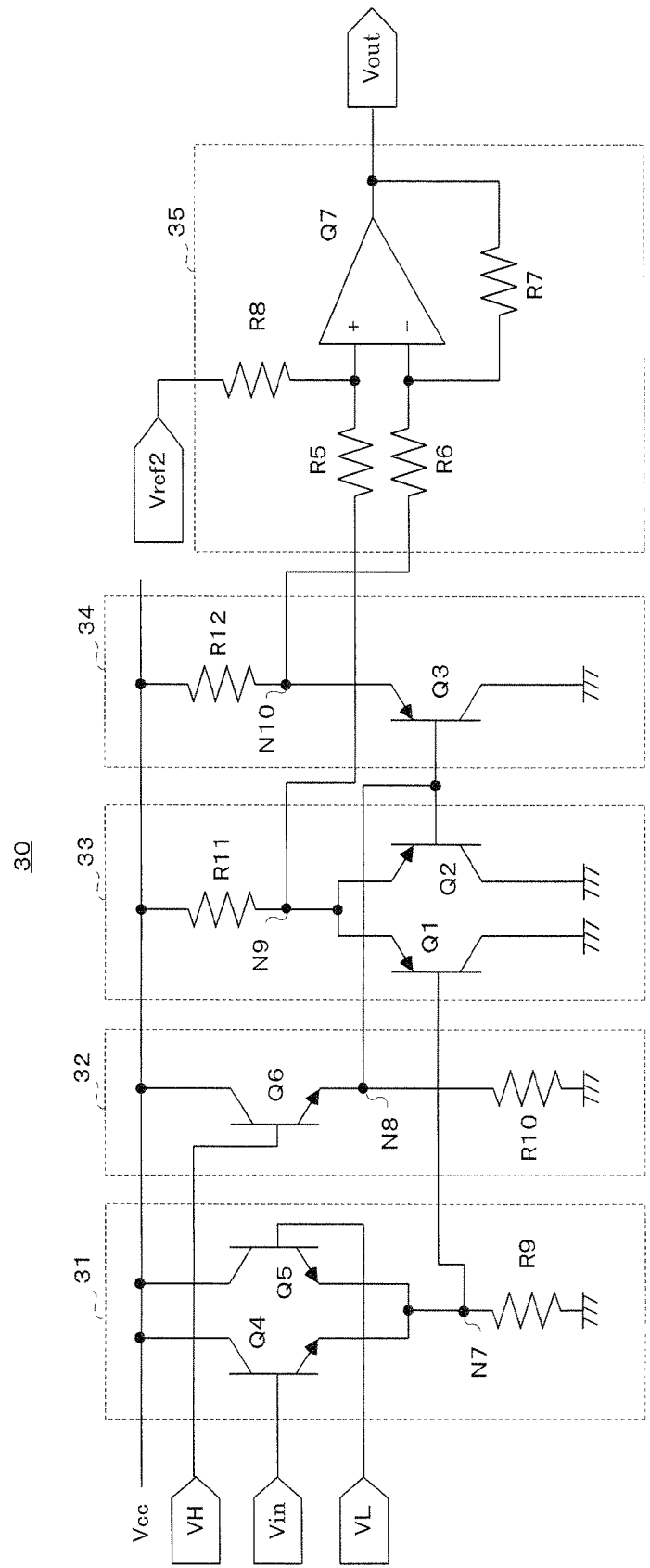
FIG. 13 is a circuit diagram showing a limiter circuit according a modification of Embodiment 1 of this invention.

As shown in FIG. 13, the limiter circuit 30 has the following construction. It includes a lower limit limiter circuit 31 having a pair of transistors Q4 and Q5 switchable ON and OFF in response to levels of an input signal voltage Vin and a lower limit threshold signal voltage VL, for cutting voltage components lower than the lower limit threshold signal voltage VL from the input signal voltage Vin, decreasing the input signal voltage Vin, and outputting a lower limit signal voltage Vn7 from a node N7; an upper limit threshold correcting circuit 32 for correcting an upper limit threshold signal voltage VH in accordance with a voltage to which the input signal Vin is decreased by the lower limit limiter circuit 31, and outputting an upper limit threshold correction signal voltage Vn8 from a node N8; an upper limit limiter circuit 33 having a different pair of transistors Q1 and Q2 switchable ON and OFF in response to levels of the lower limit signal voltage Vn7 and the upper limit threshold correction signal voltage Vn8, for cutting voltage components higher than the upper limit threshold correction signal voltage Vn8 from the lower limit signal voltage Vn7, increasing the lower limit signal voltage Vn7, and outputting an upper and lower limit signal voltage Vn9 from a node N9; a potential correcting circuit 34 for correcting the upper limit threshold correction signal voltage Vn8 in accordance with a voltage to which the lower limit signal voltage Vn7 is increased by the upper limit limiter circuit 33, and outputting a first reference signal voltage Vn10 from a node N10; and an adding and subtracting circuit 35 for generating an output signal voltage Vout by adding a second reference signal voltage Vref2 inputted separately, to a signal voltage generated according to a voltage difference between the upper and lower limit signal voltage Vn9 and the first reference signal voltage Vn10.

(2) Embodiment 2 described hereinbefore shows the construction of an upper and lower limit limiter circuit which omits the potential correcting circuit 5 from the limiter circuit 1 in the first embodiment. A limiter circuit 40 may be provided which omits the lower limit threshold correcting circuits 3 instead of omitting the potential correcting circuits 5. Both the potential correcting circuit 5 and lower limit threshold correcting circuits 3 of foregoing Embodiment 1 may be omitted, and instead, a third reference voltage may be applied to the adding and subtracting circuit 11.

Figure 14:
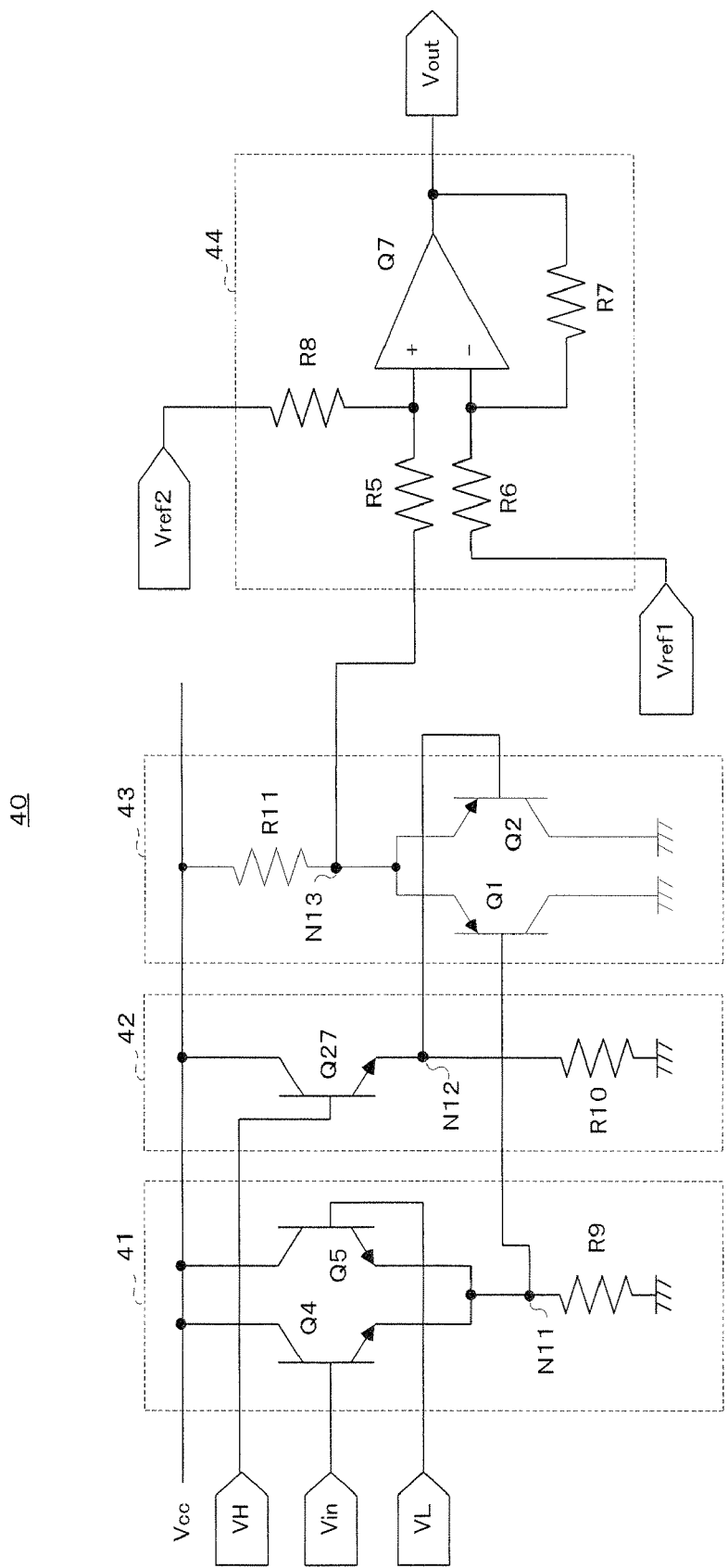
FIG. 14 is a circuit diagram showing a limiter circuit according to a modification of Embodiment 2 of this invention.

As shown in FIG. 14, the limiter circuit 40 has the following construction. It includes a lower limit limiter circuit 41 having a pair of transistors Q4 and Q5 switchable ON and OFF in response to levels of an input signal voltage Vin and a lower limit threshold signal voltage VL, for cutting voltage components lower than the lower limit threshold signal voltage VL from the input signal voltage Vin, decreasing the input signal voltage Vin, and outputting a lower limit signal voltage Vn11 from a node N11; an upper limit threshold correcting circuit 42 for correcting an upper limit threshold signal voltage VH in accordance with a voltage to which the input signal voltage Vin is decreased by the lower limit limiter circuit 41, and outputting an upper limit threshold correction signal voltage Vn12 from a node N12; an upper limit limiter circuit 43 having a different pair of transistors Q1 and Q2 switchable ON and OFF in response to levels of the lower limit signal voltage Vn11 and the upper limit threshold correction signal voltage Vn12, for cutting voltage components higher than the upper limit threshold correction signal voltage Vn12 from the lower limit signal voltage Vn11, increasing the lower limit signal voltage Vn11, and outputting an upper and lower limit signal voltage Vn13 from a node N13; and an adding and subtracting circuit 44 for generating an output signal voltage Vout by adding, to a signal voltage generated according to a voltage difference between the upper and lower limit signal voltage Vn13 and a first reference signal voltage Vref1 inputted separately, a second reference signal voltage Vref2 inputted further separately.

(3) Embodiment 3 described hereinbefore shows the construction of a lower limit limiter circuit which gives a constant lower limit to the output signal Vout at the time of application of a lower limit threshold signal which is fixed or varies with time. A limiter circuit 50 may be provided which gives a constant upper limit to the output signal Vout at the time of application of an upper limit threshold signal which is fixed or varies with time.

Figure 15:
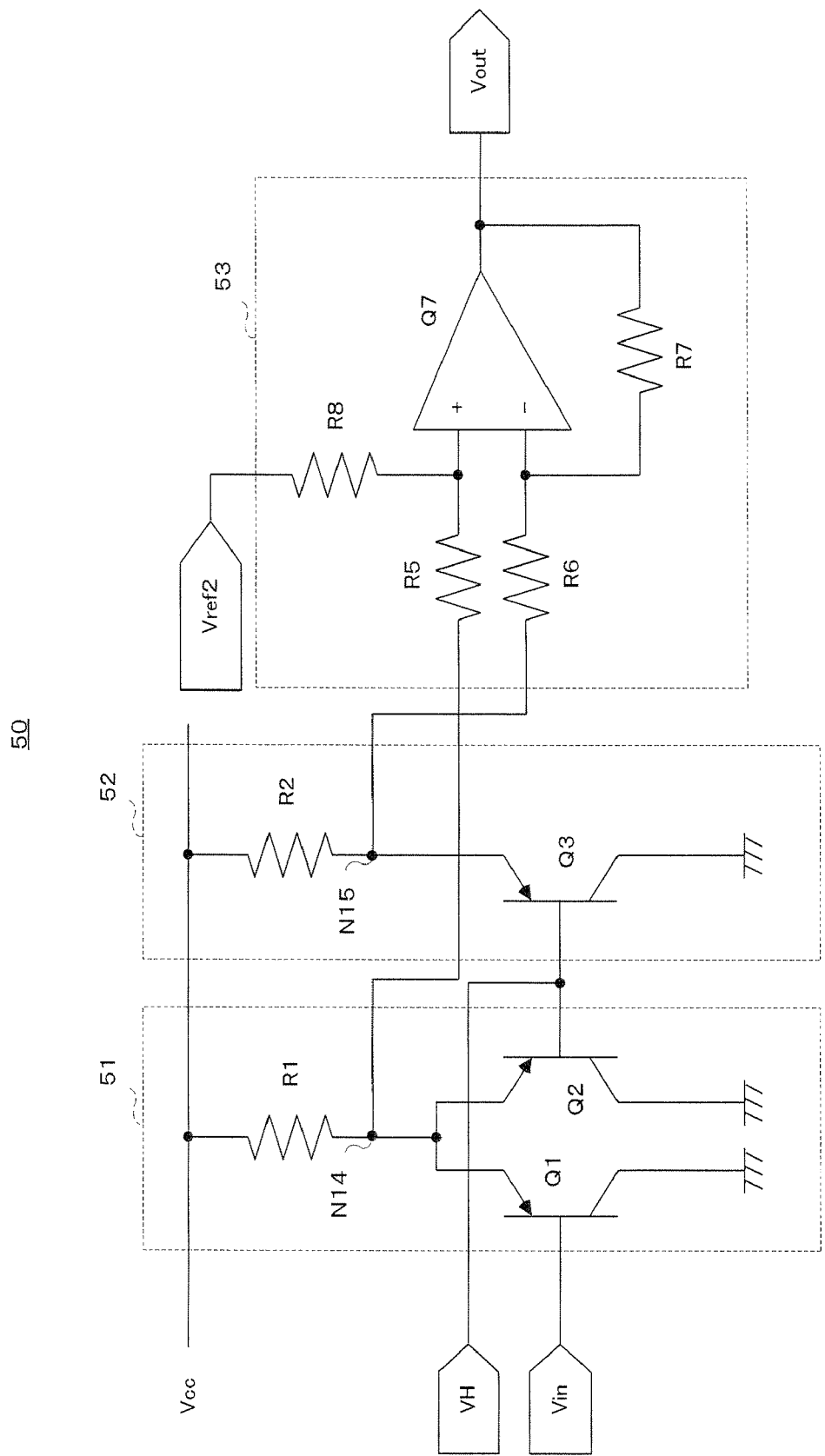
FIG. 15 is a circuit diagram showing a limiter circuit according to a modification of Embodiment 3 of this invention.

As shown in FIG. 15, the limiter circuit 50 has the following construction. It includes an upper limit limiter circuit 51 having a pair of transistors Q1 and Q2 switchable ON and OFF in response to levels of an input signal voltage Vin and an upper limit threshold signal voltage VH, increasing the input signal voltage Vin, and outputting an upper limit signal voltage Vn14 from a node N14; an upper limit threshold correcting circuit 52 for correcting the upper limit threshold signal voltage VH in accordance with a voltage to which the input signal voltage Vin is increased by the upper limit limiter circuit 51, and outputting a first reference signal voltage Vn15 from a node N15; and an adding and subtracting circuit 53 for generating an output signal voltage Vout by adding a second reference signal voltage Vref2 inputted separately, to a signal voltage generated according to a voltage difference between the upper limit signal voltage Vn14 and the first reference signal voltage Vn15.

Figure 16:
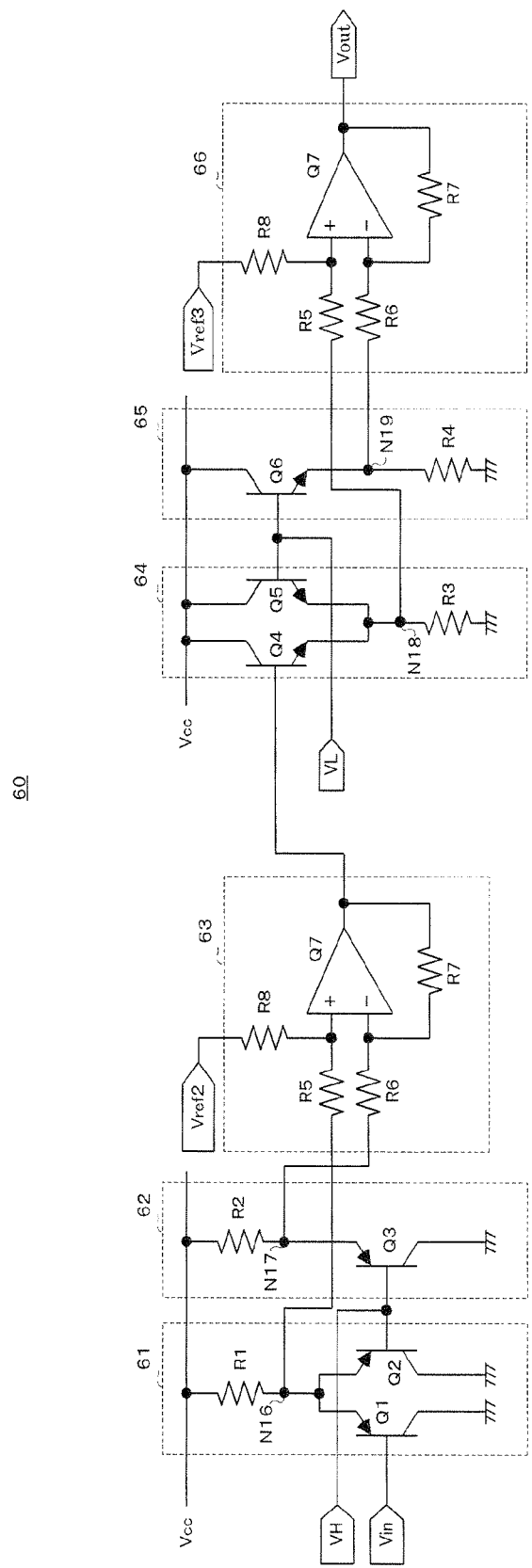
FIG. 16 is a circuit diagram showing a limiter circuit according to a modification of Embodiment 3 of this invention.
Figure 17:
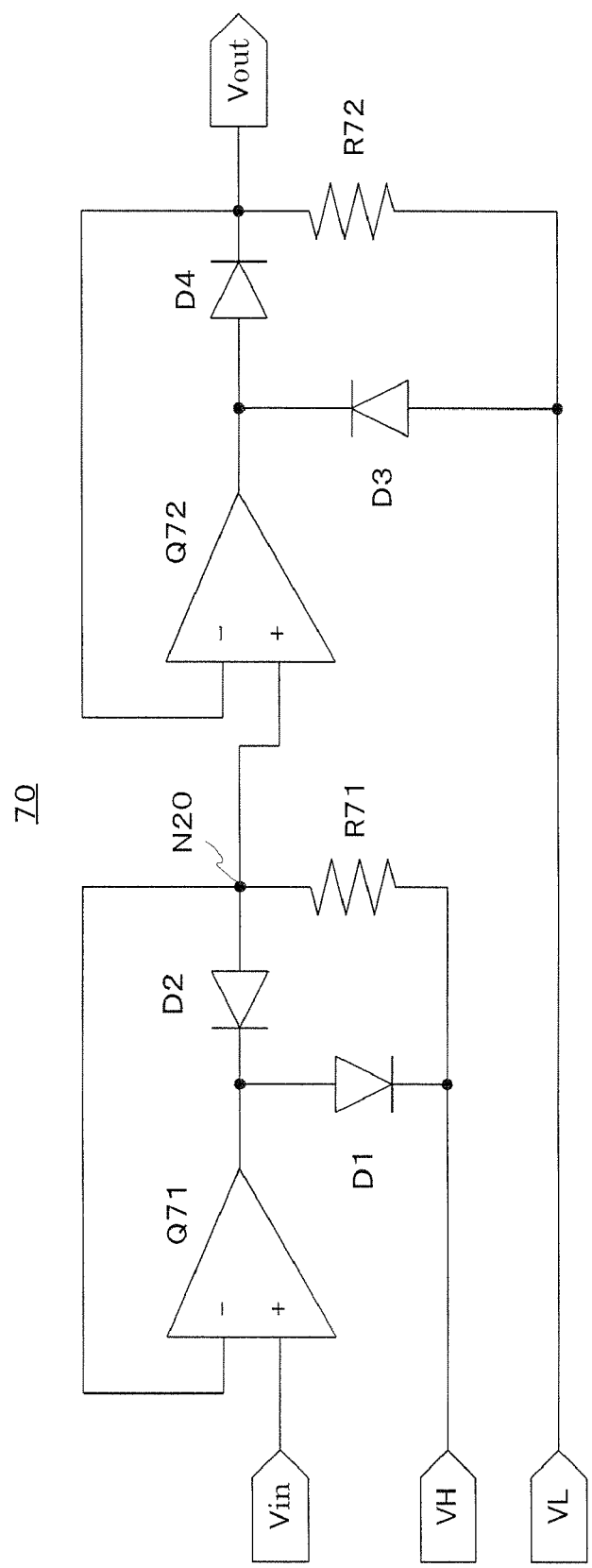
FIG. 17 is a circuit diagram showing an ideal diode circuit which is a limiter circuit in the prior art.
Figure 18A:
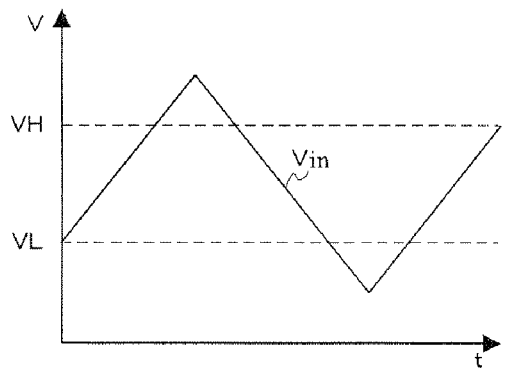
FIG. 18 is an explanatory view illustrating operation of the ideal diode circuit in the prior art.
Figure 18B:
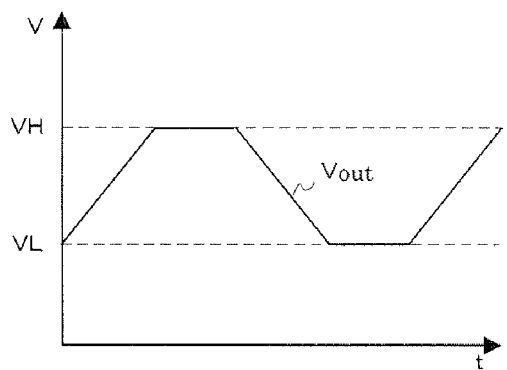
Figure 18C:
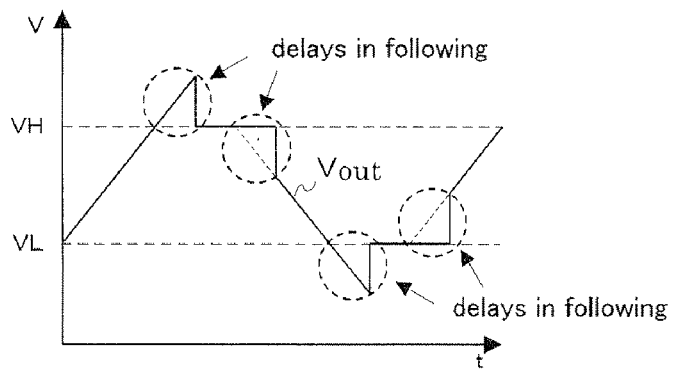

As shown in FIG. 16, a limiter circuit 60 may be formed by combining both the limiter circuit 20 and limiter circuit 50, to carry out an upper and lower limiter operation. This limiter circuit 60 is capable of a limit operation to provide a constant upper limit and lower limit also when both the upper limit threshold signal and lower limit threshold signal vary with time.

The limiter circuit 60 has the following construction. It includes an upper limit limiter circuit 61 having a pair of transistors Q1 and Q2 switchable ON and OFF in response to levels of an input signal voltage Vin and an upper limit threshold signal voltage VH, increasing the input signal voltage Vin, and outputting an upper limit signal voltage Vn16 from a node N16; an upper limit threshold correcting circuit 62 for correcting the upper limit threshold signal voltage VH in accordance with a voltage to which the input signal voltage Vin is increased by the upper limit limiter circuit 61, and outputting a first reference signal voltage Vn17 from a node N17; an adding and subtracting circuit 63 for generating an upper limit correction signal voltage by adding a second reference signal voltage Vref2 inputted separately, to a signal voltage generated according to a voltage difference between the upper limit signal voltage Vn16 and the first reference signal voltage Vn17; a lower limit limiter circuit 64 having a pair of transistors Q4 and Q5 switchable ON and OFF in response to levels of the upper limit correction signal voltage and a lower limit threshold signal voltage VL, decreasing the upper limit correction signal voltage, and outputting an upper and lower limit signal voltage Vn18 from a node N18; a potential correcting circuit 65 for correcting the lower limit threshold signal voltage VL in accordance with a voltage to which the upper limit correction signal voltage is decreased by the lower limit limiter circuit 64, and outputting a third reference signal voltage Vn19 from a node N19; and an adding and subtracting circuit 66 for generating an output signal voltage Vout by adding a fourth reference signal voltage Vref3 inputted separately, to a signal voltage generated according to a voltage difference between the upper and lower limit signal voltage Vn18 and the third reference signal voltage Vn19.

(4) The foregoing embodiments use the resistors as constant current sources. The constant current sources may be formed of active elements such as transistors.

(5) The foregoing embodiments use positive voltage source Vcc and ground voltage GND. A negative voltage source may be used instead of ground voltage GND. The positive voltage source Vcc and ground voltage GND may be replaced with a plurality of voltage sources with a potential difference, such as two positive voltage sources with a potential difference.

(6) The foregoing embodiments show the constructions of noninversion type limiter circuits. The limiter circuits may be used as the inversion type by changing connection to the adding and subtracting circuits.

(7) The foregoing embodiments use the bipolar transistors (PNP or NPN transistors). It is possible to use various known transistor elements, such as MOS transistors and MIS transistors.

The invention claimed is:

1. A limiter circuit to which an input signal voltage, an upper limit threshold signal voltage and a lower limit threshold signal voltage are inputted, comprising:

an upper limit limiter circuit having a pair of transistors switchable ON and OFF in response to levels of the input signal voltage and the upper limit threshold signal voltage, for cutting voltage components higher than the upper limit threshold signal voltage from the input signal voltage, increasing the input signal voltage, and outputting an upper limit signal voltage;

a lower limit threshold correcting circuit for correcting the lower limit threshold signal voltage in accordance with a voltage to which the input signal voltage is increased by the upper limit limiter circuit, and outputting a lower limit threshold correction signal voltage;

a lower limit limiter circuit having a differential pair of transistors switchable ON and OFF in response to levels of the upper limit signal voltage and the lower limit threshold correction signal voltage, for cutting voltage components lower than the lower limit threshold correction signal voltage from the upper limit signal voltage, decreasing the upper limit signal voltage, and outputting an upper and lower limit signal voltage;

a potential correcting circuit for correcting the lower limit threshold correction signal voltage in accordance with a voltage to which the upper limit signal voltage is decreased by the lower limit limiter circuit, and outputting a first reference signal voltage; and an adding and subtracting circuit for generating an output signal voltage by adding a second reference signal voltage inputted separately, to a signal voltage generated according to a voltage difference between the upper and lower limit signal voltage and the first reference signal voltage;

whereby the limiter circuit allows passage of only signal voltage components of the input signal voltage included in ranges of the upper limit threshold signal voltage and the lower limit threshold signal voltage.

2. The limiter circuit according to claim 1, wherein:

the upper limit limiter circuit includes a pair of first and second PNP transistors having emitter terminals connected to each other, and a first constant current generating device connected between the emitter terminals of the first and second PNP transistors and a first common voltage, the input signal voltage being inputted to a base terminal of the first PNP transistor, the upper limit threshold signal voltage being inputted to a base terminal of the second PNP transistor, the first constant current generating device limiting current flow to the first or second PNP transistor;

the lower limit threshold correcting circuit includes a third PNP transistor having a base terminal for receiving input of the lower limit threshold signal voltage, and a second constant current generating device connected between an emitter terminal of the third PNP transistor and the first common voltage, the second constant current generating device limiting current flow to the third PNP transistor;

the lower limit limiter circuit includes a pair of first and second NPN transistors having emitter terminals connected to each other, and a third constant current generating device connected between the emitter terminals of the first and second NPN transistors and a second common voltage, the emitter terminals of the first and second PNP transistors being connected to a base terminal of the first NPN transistor, the emitter terminal of the third PNP transistor being connected to a base terminal of the second NPN transistor, the third constant current generating device limiting current flow to the first or second PNP transistor;

the potential correcting circuit includes a third NPN transistor having a base terminal connected with the emitter terminal of the third PNP transistor, and a fourth constant current generating device connected between an emitter terminal of the third NPN transistor and the second common voltage, the fourth constant current generating device limiting current flow to the third NPN transistor; and the adding and subtracting circuit includes a differential amplifier having a positive input node connected with the emitter terminals of the first and second NPN transistors through a first input resistor, and a negative input node connected with the emitter terminal of the third NPN transistor through a second input resistor, an output terminal and the negative input node of the differential amplifier being connected through a feedback resistor, the second reference signal voltage being inputted to the positive input node of the differential amplifier through a compensation resistor.

3. The limiter circuit according to claim 2, wherein the second common voltage is a ground voltage.

4. A limiter circuit to which an input signal voltage, an upper limit threshold signal voltage and a lower limit threshold signal voltage are inputted, comprising:

an upper limit limiter circuit having a pair of transistors switchable ON and OFF in response to levels of the input signal voltage and the upper limit threshold signal voltage, for cutting voltage components higher than the upper limit threshold signal voltage from the input signal voltage, increasing the input signal voltage, and outputting an upper limit signal voltage;

a lower limit threshold correcting circuit for correcting the lower limit threshold signal voltage in accordance with a voltage to which the input signal voltage is increased by the upper limit limiter circuit, and outputting a lower limit threshold correction signal voltage;

a lower limit limiter circuit having a differential pair of transistors switchable ON and OFF in response to levels of the upper limit signal voltage and the lower limit threshold correction signal voltage, for cutting voltage components lower than the lower limit threshold correction signal voltage from the upper limit signal voltage, decreasing the upper limit signal voltage, and outputting an upper and lower limit signal voltage; and an adding and subtracting circuit for generating an output signal voltage by adding, to a signal voltage generated according to a voltage difference between the upper and lower limit signal voltage and a first reference signal voltage inputted separately, a second reference signal voltage inputted further separately;

whereby the limiter circuit allows passage of only signal voltage components of the input signal voltage included in ranges of the upper limit threshold signal voltage and the lower limit threshold signal voltage.

5. The limiter circuit according to claim 4, wherein:

the upper limit limiter circuit includes a pair of first and second PNP transistors having emitter terminals connected to each other, and a first constant current generating device connected between the emitter terminals of the first and second PNP transistors and a first common voltage, the input signal voltage being inputted to a base terminal of the first PNP transistor, the upper limit threshold signal voltage being inputted to a base terminal of the second PNP transistor, the first constant current generating device limiting current flow to the first or second PNP transistor;

the lower limit threshold correcting circuit includes a third PNP transistor having a base terminal for receiving input of the lower limit threshold signal voltage, and a second constant current generating device connected between an emitter terminal of the third PNP transistor and the first common voltage, the second constant current generating device limiting current flow to the third PNP transistor;

the lower limit limiter circuit includes a pair of first and second NPN transistors having emitter terminals connected to each other, and a third constant current generating device connected between the emitter terminals of the first and second NPN transistors and a second common voltage, the emitter terminals of the first and second PNP transistors being connected to a base terminal of the first NPN transistor, the emitter terminal of the third PNP transistor being connected to a base terminal of the second NPN transistor, the third constant current generating device limiting current flow to the first or second PNP transistor; and the adding and subtracting circuit includes a differential amplifier having a positive input node connected with the emitter terminals of the first and second NPN transistors through a first input resistor, and a negative input node connected with the first reference signal voltage through a second input resistor, an output terminal and the negative input node of the differential amplifier being connected through a feedback resister, the second reference signal voltage being inputted to the positive input node of the differential amplifier through a compensation resistor.

6. The limiter circuit according to claim 5, wherein the second common voltage is a ground voltage.

7. A limiter circuit to which an input signal voltage and a lower limit threshold signal voltage are inputted, comprising:

a lower limit limiter circuit having a pair of transistors switchable ON and OFF in response to levels of the input signal voltage and lower limit threshold correction signal voltage, for decreasing the input signal voltage, and outputting a lower limit signal voltage;

a potential correcting circuit for correcting the lower limit threshold signal voltage in accordance with a voltage to which the input signal voltage is decreased by the lower limit limiter circuit, and outputting a first reference signal voltage; and an adding and subtracting circuit for generating an output signal voltage by adding a second reference signal voltage inputted separately, to a signal voltage generated according to a voltage difference between the lower limit signal voltage and the first reference signal voltage;

whereby the limiter circuit allows passage of only signal voltage components of the input signal voltage higher than the lower limit threshold signal voltage.

8. The limiter circuit according to claim 7, wherein:

the lower limit limiter circuit includes a pair of first and second NPN transistors having emitter terminals connected to each other, and a first constant current generating device connected between the emitter terminals of the first and second NPN transistors and a common voltage, the input signal being connected to a base terminal of the first NPN transistor, the lower limit threshold signal voltage being inputted to a base terminal of the second NPN transistor, the first constant current generating device limiting current flow to the first or second NPN transistor;

the potential correcting circuit includes a third NPN transistor having a base terminal to which the lower limit threshold signal voltage is inputted, and a second constant current generating device connected between an emitter terminal of the third NPN transistor and the common voltage, the second constant current generating device limiting current flow to the third NPN transistor; and the adding and subtracting circuit includes a differential amplifier having a positive input node connected with the emitter terminals of the first and second NPN transistors through a first input resistor, and a negative input node connected with the emitter terminal of the third NPN transistor through a second input resistor, an output terminal and the negative input node of the differential amplifier being connected through a feedback resistor, the second reference signal voltage being connected to the positive input node of the differential amplifier through a compensation resistor.

9. The limiter circuit according to claim 8, wherein the second common voltage is a ground voltage.

10. A limiter circuit to which an input signal voltage, an upper limit threshold signal voltage and a lower limit threshold signal voltage are inputted, comprising:

a lower limit limiter circuit having a pair of transistors switchable ON and OFF in response to levels of the input signal voltage and the lower limit threshold signal voltage, for cutting voltage components lower than the lower limit threshold signal voltage from the input signal voltage, decreasing the input signal voltage, and outputting a lower limit signal voltage;

an upper limit threshold correcting circuit for correcting the upper limit threshold signal voltage in accordance with a voltage to which the input signal voltage is decreased by the lower limit limiter circuit, and outputting a lower limit threshold correction signal voltage;

an upper limit limiter circuit having a differential pair of transistors switchable ON and OFF in response to levels of the lower limit signal voltage and the upper limit threshold correction signal voltage, for cutting voltage components higher than the upper limit threshold correction signal voltage from the lower limit signal voltage, increasing the lower limit signal voltage, and outputting an upper and lower limit signal voltage;

a potential correcting circuit for correcting the upper limit threshold correction signal voltage in accordance with a voltage to which the lower limit signal voltage is increased by the upper limit limiter circuit, and outputting a first reference signal voltage; and an adding and subtracting circuit for generating an output signal voltage by adding a second reference signal voltage inputted separately, to a signal voltage generated according to a voltage difference between the upper and lower limit signal voltage and the first reference signal voltage;

whereby the limiter circuit allows passage of only signal voltage components of the input signal voltage included in ranges of the upper limit threshold signal voltage and the lower limit threshold signal voltage.

11. A limiter circuit to which an input signal voltage, an upper limit threshold signal voltage and a lower limit threshold signal voltage are inputted, comprising:

a lower limit limiter circuit having a pair of transistors switchable ON and OFF in response to levels of the input signal voltage and the lower limit threshold signal voltage, for cutting voltage components lower than the lower limit threshold signal voltage from the input signal voltage, decreasing the input signal voltage, and outputting a lower limit signal voltage;

an upper limit threshold correcting circuit for correcting the upper limit threshold signal voltage in accordance with a voltage to which the input signal voltage is decreased by the lower limit limiter circuit, and outputting a upper limit threshold correction signal voltage;

an upper limit limiter circuit having a differential pair of transistors switchable ON and OFF in response to levels of the lower limit signal voltage and the upper limit threshold correction signal voltage, for cutting voltage components higher than the upper limit threshold correction signal voltage from the lower limit signal voltage, increasing the lower limit signal voltage, and outputting an upper and lower limit signal voltage;

an adding and subtracting circuit for generating an output signal voltage by adding, to a signal voltage generated according to a voltage difference between the upper and lower limit signal voltage and a first reference signal voltage inputted separately, a second reference signal voltage inputted further separately;

whereby the limiter circuit allows passage of only signal voltage components of the input signal voltage included in ranges of the upper limit threshold signal voltage and the lower limit threshold signal voltage.

12. A limiter circuit to which an input signal voltage and an upper limit threshold signal voltage are inputted, comprising:

an upper limit limiter circuit having a pair of transistors switchable ON and OFF in response to levels of the input signal voltage and the upper limit threshold signal voltage, for increasing the input signal voltage, and outputting an upper limit signal voltage;

an upper limit threshold correcting circuit for correcting the upper limit threshold signal voltage in accordance with a voltage to which the input signal voltage is increased by the upper limit limiter circuit, and outputting a first reference signal voltage; and an adding and subtracting circuit for generating an output signal voltage by adding a second reference signal voltage inputted separately, to a signal voltage generated according to a voltage difference between the upper limit signal voltage and the first reference signal voltage;

whereby the limiter circuit allows passage of only signal voltage components of the input signal voltage lower than the lower limit threshold signal voltage.

13. A limiter circuit to which an input signal voltage, an upper limit threshold signal voltage and a lower limit threshold signal voltage are inputted, comprising:

an upper limit limiter circuit having a pair of transistors switchable ON and OFF in response to levels of the input signal voltage and the upper limit threshold signal voltage, for increasing the input signal voltage, and outputting an upper limit signal voltage;

an upper limit threshold correcting circuit for correcting the upper limit threshold signal voltage in accordance with a voltage to which the input signal voltage is increased by the upper limit limiter circuit, and outputting a first reference signal voltage;

an adding and subtracting circuit for generating an upper limit correction signal voltage by adding a second reference signal voltage inputted separately, to a signal voltage generated according to a voltage difference between the upper limit signal voltage and the first reference signal voltage;

a lower limit limiter circuit having a pair of transistors switchable ON and OFF in response to levels of the upper limit correction signal voltage and the lower limit threshold correction signal voltage, for decreasing the lower limit correction signal voltage, and outputting an upper and lower limit signal voltage;

a potential correcting circuit for correcting the lower limit threshold signal voltage in accordance with a voltage to which the upper limit correction signal voltage is decreased by the lower limit limiter circuit, and outputting a third reference signal voltage; and an adding and subtracting circuit for generating an output signal voltage by adding a fourth reference signal voltage inputted separately, to a signal voltage generated according to a voltage difference between the upper and lower limit signal voltage and the third reference signal voltage;

whereby the limiter circuit allows passage of only signal voltage components of the input signal voltage included in ranges of the upper limit threshold signal voltage and the lower limit threshold signal voltage.

* * * * *

UNITED STATES PATENT AND TRADEMARK OFFICE
CERTIFICATE OF CORRECTION

PATENT NO. : 8,330,520 B2
APPLICATION NO. : 12/996636
DATED : December 11, 2012
INVENTOR(S) : Tetsuo Furumiya and Junichi Ohi It is certified that error appears in the above-identified patent and that said Letters Patent is hereby corrected as shown below:

In the Claims

Claim 1, Column 21, line 37, the term "differential" should be deleted.

Claim 4, Column 22, line 62, the term "differential" should be deleted.

Claim 10, Column 24, line 60, the term "differential" should be deleted.

Claim 11, Column 25, line 31, the term "differential" should be deleted.

Signed and Sealed this
Eighth Day of July, 2014

Michelle K. Lee
*Deputy Director of the United States Patent and Trademark Office*